(12) United States Patent
Izawa

(10) Patent No.: US 11,474,391 B2
(45) Date of Patent: Oct. 18, 2022

(54) ELECTRO-OPTICAL DEVICE, MANUFACTURING METHOD FOR ELECTRO-OPTICAL DEVICE, AND ELECTRONIC APPARATUS

(71) Applicant: SEIKO EPSON CORPORATION, Tokyo (JP)

(72) Inventor: Shotaro Izawa, Chitose (JP)

(73) Assignee: SEIKO EPSON CORPORATION, Tokyo (JP)

( * ) Notice: Subject to any disclaimer, the term of this patent is extended or adjusted under 35 U.S.C. 154(b) by 84 days.

(21) Appl. No.: 17/118,553

(22) Filed: Dec. 10, 2020

(65) Prior Publication Data

US 2021/0181573 A1 Jun. 17, 2021

(30) Foreign Application Priority Data

Dec. 11, 2019 (JP) .............................. JP2019-223507

(51) Int. Cl.
*G02F 1/1335* (2006.01)
*G02F 1/1333* (2006.01)
(Continued)

(52) U.S. Cl.
CPC ...... *G02F 1/133526* (2013.01); *G02F 1/1368* (2013.01); *G02F 1/13306* (2013.01); *G02F 1/133345* (2013.01); *G02F 1/134309* (2013.01); *G02F 1/136209* (2013.01); *H01L 27/1214* (2013.01); *G02F 2201/123* (2013.01); *G02F 2203/01* (2013.01)

(58) Field of Classification Search
CPC ............. G02F 1/1333; G02F 1/133345; G02F 1/1335; G02F 1/133512; G02F 1/133526; G02F 1/1343; G02F 1/134309; G02F 1/1362; G02F 1/136209; G02F 1/1368; G02F 2201/123; G02F 2203/01; H01L 27/1214; H01L 27/124

See application file for complete search history.

(56) References Cited

U.S. PATENT DOCUMENTS

2016/0245961 A1  8/2016  Akasaka
2019/0064584 A1  2/2019  Ito

FOREIGN PATENT DOCUMENTS

JP  2015094879  5/2015
JP  2016151735  8/2016
(Continued)

*Primary Examiner* — Thoi V Duong
(74) *Attorney, Agent, or Firm* — JCIPRNET

(57) ABSTRACT

An electro-optical device, which includes a display area and a peripheral area, includes a transmissive base member, a plurality of pixel electrodes, a transmissive lens layer having a plurality of lenses disposed corresponding to the plurality of pixel electrodes, an insulating layer disposed between the transmissive base member and the transmissive lens layer, and a light-shielding film disposed between the transmissive base member and the insulating layer, and having a light-shielding property. The insulating layer has a contact surface in contact with the transmissive lens layer, and has a refractive index different from a refractive index of the transmissive lens layer. The contact surface has a first surface located in the display area, and a second surface located in the peripheral area. The first surface has a plurality of first recessed portions disposed corresponding to the plurality of lenses, and the second surface has one or more second recessed portions.

5 Claims, 16 Drawing Sheets

(51) Int. Cl.
*G02F 1/1368* (2006.01)
*G02F 1/1362* (2006.01)
*G02F 1/1343* (2006.01)
*H01L 27/12* (2006.01)
*G02F 1/133* (2006.01)

(56) References Cited

FOREIGN PATENT DOCUMENTS

| | | |
|---|---|---|
| JP | 2016224459 | 12/2016 |
| JP | 2019040153 | 3/2019 |

ELECTRO-OPTICAL DEVICE,
MANUFACTURING METHOD FOR
ELECTRO-OPTICAL DEVICE, AND
ELECTRONIC APPARATUS

The present application is based on, and claims priority from JP Application Serial Number 2019-223507, filed Dec. 11, 2019, the disclosure of which is hereby incorporated by reference herein in its entirety.

BACKGROUND

1. Technical Field

The present disclosure relates to an electro-optical device, a manufacturing method of an electro-optical device, and an electronic apparatus.

2. Related Art

An electro-optical device such as a liquid crystal device capable of changing optical characteristics for each pixel is generally used for an electronic apparatus such as a projector. For example, an electro-optical device described in JP 2019-40153 A includes an element substrate provided with a pixel electrode and a switching element, a counter substrate provided with a common electrode, and a liquid crystal layer disposed between these substrates.

The element substrate described in JP 2019-40153 A includes a laminate including a plurality of interlayer insulating films, a wiring line disposed in the laminate, a switching element disposed in the laminate, and a lens layer including a lens disposed between the switching element and the pixel electrode. The lens layer is formed as follows. First, a recessed portion is formed in the interlayer insulating film provided on the switching element. Next, the lens layer is formed as a film and formed of a silicon oxynitride film that fills an inside of the recessed portion. Then, the lens layer is formed by performing a flattening process on the lens layer.

When the lens layer is formed as a film, warping of the element substrate due to residual stress in the lens layer occurs. This warping is an obstacle for the flattening process on the lens layer, and thus, it is necessary to suppress the warping of the element substrate. The warping is mitigated by annealing. However, when a lens layer is provided between a plurality of switching elements and a plurality of pixel electrodes, the annealing is not appropriate. This is because, when the annealing is performed, there is a possibility that the plurality of switching elements, wiring lines, and the like disposed in lower layers than the lens layer are damaged.

In addition, in general, when a flattening process is performed on a lens layer, at a boundary between a portion of a display area and a portion of a peripheral area of a surface of the lens layer, a so-called global step is formed. The global step is generated, due to a density difference between the portion of the display area and the portion of the peripheral area, since the portion of the display area is polished deeper than the portion of the peripheral area. For the purpose of mitigating the global step, for example, it is conceivable, after a part of the portion of the peripheral area is removed by etching using a mask, to perform a flattening process. However, when warping of an element substrate is not suppressed, the etching cannot be performed with high precision. Thus, when warping of an element substrate is not mitigated, there is a problem in that it is difficult to mitigate a global step.

SUMMARY

An aspect of an electro-optical device according to the present disclosure is an electro-optical device including a display area, and a peripheral area located outside the display area in plan view, that includes a transmissive base member, a plurality of pixel electrodes located in the display area, a transmissive lens layer having a plurality of lenses disposed corresponding to the plurality of pixel electrodes, an insulating layer disposed between the base member and the lens layer, the insulating layer having a contact surface in contact with the lens layer, and having a refractive index different from a refractive index of the lens layer, and a light-shielding film disposed between the base member and the insulating layer, and having a light-shielding property, wherein the contact surface has a first surface located in the display area, and a second surface located in the peripheral area, the first surface has a plurality of first recessed portions disposed corresponding to the plurality of lenses, and the second surface has one or more second recessed portions.

An aspect of a manufacturing method of an electro-optical device according to the present disclosure is a method of manufacturing an electro-optical device having a display area in which a plurality of pixel electrodes are disposed, and a peripheral area located outside the display area, that forms a light-shielding film having a light-shielding property, at a transmissive base member, forms a transmissive insulating layer having one or more second recessed portions located in the peripheral area, at the light-shielding film, forms a plurality of first recessed portions in the display area of the insulating layer, and forms a lens layer that fills the one or more second recessed portions and the plurality of first recessed portions of the insulating layer, and has a refractive index different from a refractive index of the insulating layer.

DESCRIPTION OF EXEMPLARY EMBODIMENTS

Figure 1:
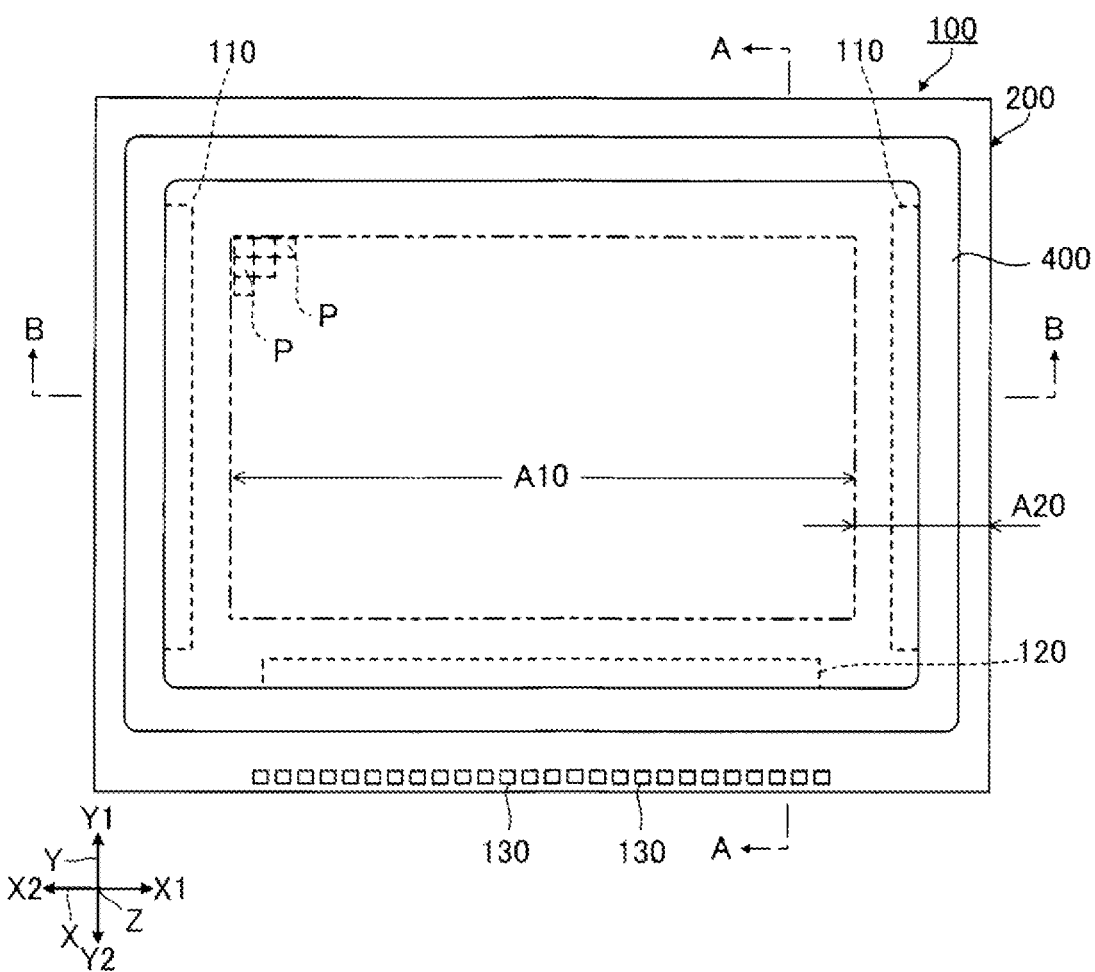
FIG. 1 is a plan view of an electro-optical device according to a first exemplary embodiment.

Preferred embodiments of the present disclosure will be described below with reference to the accompanying drawings. Note that, in the drawings, dimensions and scales of sections are differed from actual dimensions and scales as appropriate, and some of the sections are schematically illustrated to make them easily recognizable. Further, the scope of the present disclosure is not limited to these embodiments unless otherwise stated to limit the present disclosure in the following descriptions.

1. Electro-Optical Device

1A. First Exemplary Embodiment 1A-1. Basic Configuration

Figure 2:
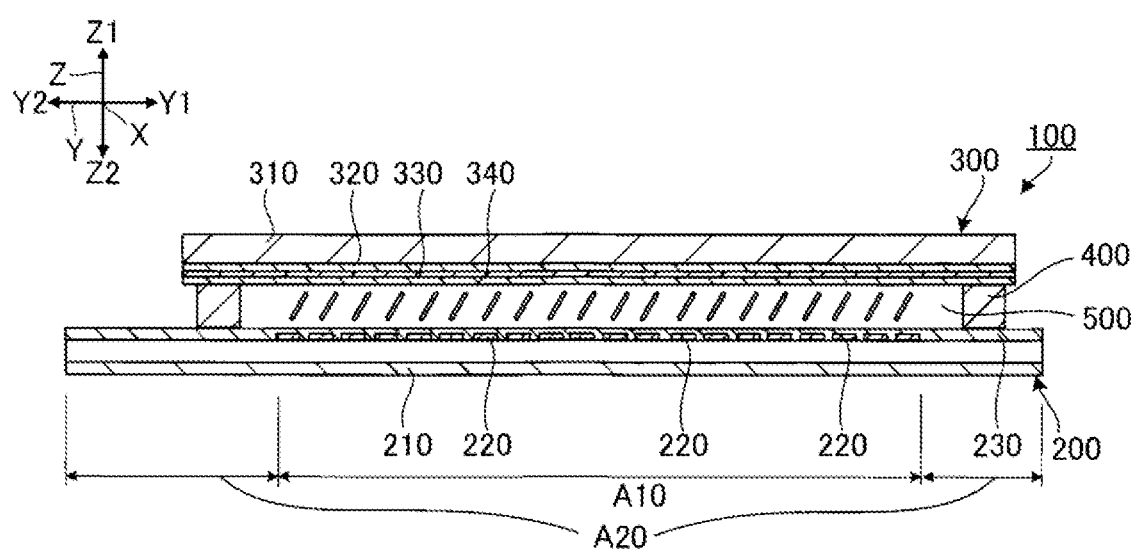
FIG. 2 is a cross-sectional view of the electro-optical device illustrated in FIG. 1.

FIG. 1 is a plan view of an electro-optical device 100 according to a first exemplary embodiment. FIG. 2 is a cross-sectional view of the electro-optical device 100 illustrated in FIG. 1 taken along a line A-A. Note that, in FIG. 1, illustration of a counter substrate 300 is omitted. Note that, in the following, for convenience of explanation, the description will be made appropriately using an X-axis, a Y-axis, and a Z-axis orthogonal to each other. Further, one direction along the X-axis is referred to as an X1 direction, and a direction opposite to the X1 direction is referred to as an "X2 direction". Similarly, one direction along the Y-axis is referred to as a Y1 direction, and a direction opposite to the Y1 direction is referred to as a Y2 direction. One direction along the Z-axis is referred to as a Z1 direction, and a direction opposite to the Z1 direction is referred to as a Z2 direction.

The electro-optical device 100 illustrated in FIG. 1 and FIG. 2 is a transmission-type liquid crystal display device of an active matrix driving type. As illustrated in FIG. 2, the electro-optical device 100 includes a transmissive element substrate 200, the counter substrate 300 being transmissive, a frame-shaped sealing member 400, and a liquid crystal layer 500. The sealing member 400 is disposed between the element substrate 200 and the counter substrate 300. The liquid crystal layer 500 is disposed in a region surrounded by the element substrate 200, the counter substrate 300, and the sealing member 400. Here, the element substrate 200, the liquid crystal layer 500, and the counter substrate 300 are arranged along the Z-axis. A surface of a first base body 210 described below included in the element substrate 200 is parallel to an X-Y plane. In the following, viewing in a +Z direction or a −Z direction is referred to as "in plan view".

In the electro-optical device 100 of the present exemplary embodiment, for example, light generated from a light source is incident on the element substrate 200, transmitted through the liquid crystal layer 500, and emitted from the counter substrate 300. Note that, light may be incident on the counter substrate 300, transmitted through the liquid crystal layer 500, and emitted from the element substrate 200. Further, light is visible light. "Transmissive" means transmissive for visible light, and may refer to transmittance for visible light equal to or larger than 50%. A "light shielding property" means a light shielding property for visible light, and may refer to transmittance for visible light equal to or less than 50%, and may refer to transmittance for visible light equal to or less than 10%. Further, the electro-optical device 100 illustrated in FIG. 1 has a rectangular shape in plan view, but a shape of the electro-optical device 100 in plan view is not limited thereto, and may be a round shape and the like.

As illustrated in FIG. 2, the element substrate 200 includes the first base body 210, a plurality of pixel electrodes 220, and a first alignment film 230. The first base body 210 is formed of a flat plate being transmissive and having insulating properties. The pixel electrode 220 is transmissive, and formed of a transparent conductive material such as indium tin oxide (ITO) or indium zinc oxide (IZO), for example. The first alignment film 230 is located closest to the liquid crystal layer 500 in the element substrate 200, and aligns liquid crystal molecules of the liquid crystal layer 500. Examples of a constituent material of the first alignment film 230 include polyimide and silicon oxide, for example. Note that, a detailed configuration of the element substrate 200 will be described below.

As illustrated in FIG. 2, the counter substrate 300 includes a second base body 310, an insulating layer 320, a common electrode 330, and a second alignment film 340. The second base body 310, the insulating film 320, the common electrode 330, and the second alignment film 340 are arranged in this order. Of these, the second alignment film 340 is located closest to the liquid crystal layer 500. The second base body 310 is formed of a flat plate being transmissive and having insulating properties. The second base body 310 is formed of glass, quartz, or the like, for example. The common electrode 330 is formed of a transparent conductive material such as ITO or IZO, for example. In addition, the second alignment film 340 aligns the liquid crystal molecules of the liquid crystal layer 500. Examples of a constituent material of the second alignment film 340 include polyimide and silicon oxide, for example.

The sealing member 400 is formed, for example, by using an adhesive containing various types of hardening resins such as epoxy resin, or the like, and is a member with a frame shape. The sealing member 400 is fixed to each of the element substrate 200 and the counter substrate 300.

The liquid crystal layer 500 is an electro-optical layer that is disposed between the plurality of pixel electrodes 220 and the common electrode 330, and in which optical characteristics change in accordance with an electric field. More specifically, the liquid crystal layer 500 contains liquid crystal molecules having positive or negative dielectric anisotropy. The liquid crystal layer 500 is interposed between the element substrate 200 and the counter substrate 300 such that the liquid crystal molecules are in contact with both the first alignment film 230 and the second alignment film 340. The alignment of the liquid crystal molecules included in the liquid crystal layer 500 varies depending on a voltage applied to the liquid crystal layer 500. The liquid crystal layer 500 allows grayscale display by modulating light in accordance with the applied voltage.

As illustrated in FIG. 1, a plurality of scanning line drive circuits 110, a signal line driving circuit 120, and a plurality of external terminals 130 are disposed, on a surface in the element substrate 200 on a side of the counter substrate 300. A lead wiring line (not illustrated) drawn from the scanning line drive circuit 110 or the signal line driving circuit 120 is coupled to each the external terminal 130.

The electro-optical device 100 having the configuration described above includes a display area A10 that displays an image, and a peripheral area A20 located outside the display area A10 in plan view. The display area A10 is provided with a plurality of pixels P arranged in a matrix. The plurality of pixel electrodes 220 are disposed corresponding to the plurality of pixels P in a one-to-one manner. Thus, the plurality of pixel electrodes 220 are located in the display area A10. The peripheral area A20 surrounds the display area A10 in plan view. The scanning line drive circuit 110, the signal line driving circuit 120, and the like are disposed in the peripheral area A20.

1A-2. Electrical Configuration of Element Substrate 200

Figure 3:
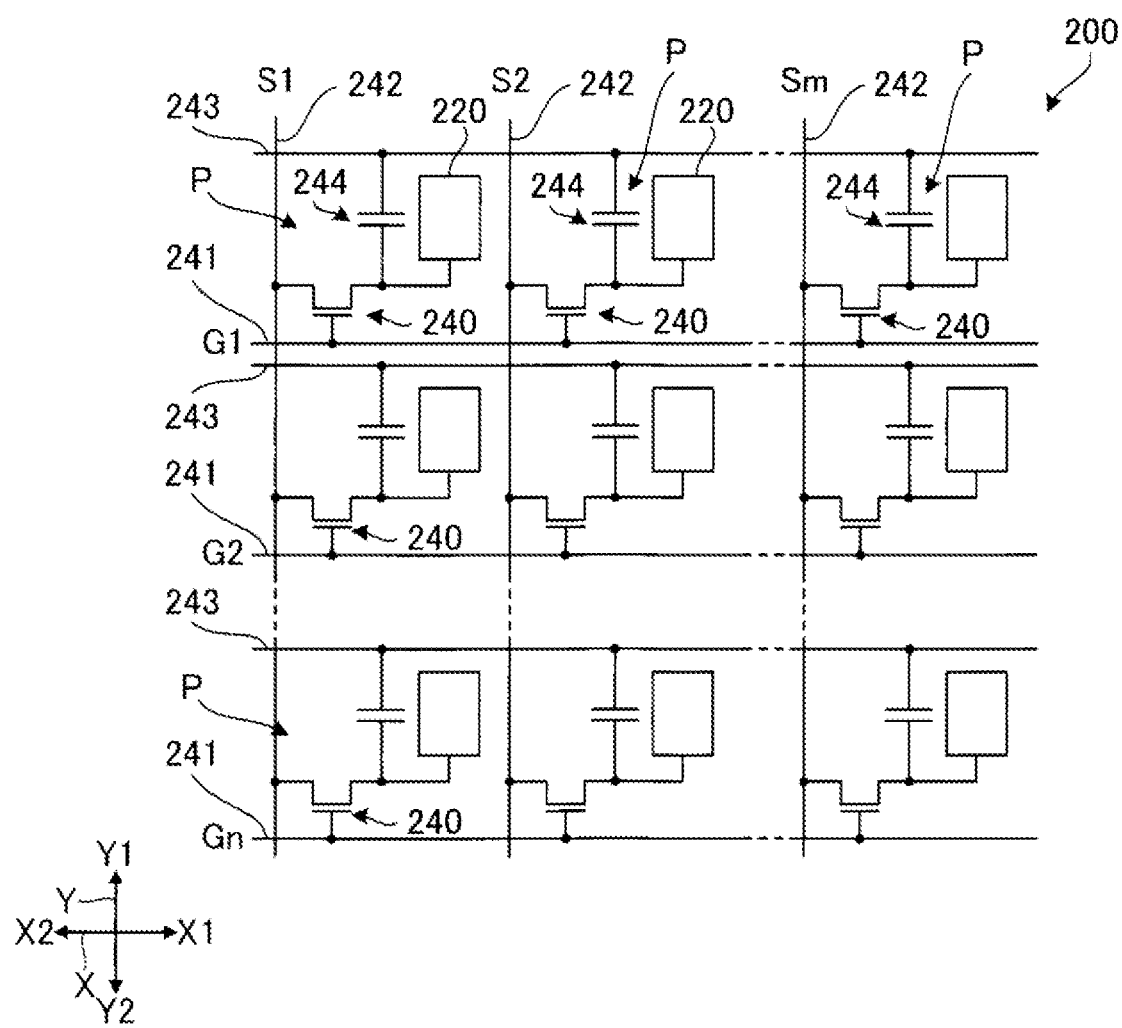
FIG. 3 is an equivalent circuit diagram illustrating an electrical configuration of an element substrate.

FIG. 3 is an equivalent circuit diagram illustrating an electrical configuration of the element substrate 200. As illustrated in FIG. 3, the element substrate 200 is provided with n number of scanning lines 241, m number of signal lines 242, and n number of capacitance lines 243. Each of n and m is an integer of 2 or larger. A transistor 240 is disposed corresponding to each of intersections among the n scanning lines 241 and the m signal lines 242. Each the transistor 240 is a TFT that functions as a switching element, for example. Each the transistor 240 includes a gate, a source, and a drain.

Each of the n scanning lines 241 extends along the X-axis, and the n scanning lines 241 are arranged at equal intervals along the Y-axis. Each of the n scanning lines 241 is electrically coupled to the gate of each of some number of the transistors 240 of all of the transistors 240. The n scanning lines 241 are electrically coupled to the scanning line drive circuit 110 illustrated in FIG. 1. To first to n-th scanning lines 241, scanning signals G1, G2, . . . , Gn are line-sequentially and respectively supplied from the scanning line drive circuit 110.

Each of the m signal lines 242 illustrated in FIG. 3 extends along the Y-axis, and the m signal lines 242 are arranged at equal intervals along the X-axis. Each of the m signal lines 242 is electrically coupled to the source of each of some number of the transistors 240 of all of the transistors 240. The m signal lines 242 are electrically coupled to the signal line driving circuit 120 illustrated in FIG. 1. To first to m-th signal lines 242, image signals S1, S2, . . . , and Sm are supplied in parallel respectively from the signal line driving circuit 120.

The n scanning lines 241 and the m signal lines 242 illustrated in FIG. 3 are electrically insulated from each other and are disposed in a lattice in plan view. A region surrounded by two number of the scanning lines 241 adjacent to each other and two number of the signal lines 242 adjacent to each other corresponds to the pixel P. Each the pixel electrode 220 is electrically coupled to the drain of the transistor 240 corresponding thereto.

Each of the n capacitance lines 243 extends along the X-axis, and the n capacitance lines 243 are arranged at equal intervals along the Y-axis. Additionally, the n capacitance lines 243 are electrically insulated from the m signal lines 242 and the n scanning lines 241, and are disposed so as to be spaced therefrom. Fixed potential such as ground potential is applied to each the capacitance line 243. Each of the n capacitance lines 243 is electrically coupled to some number of storage capacitors 244 of all the storage capacitors 244. A plurality of the storage capacitors 244 are electrically coupled to the plurality of pixel electrodes 220 in a one-to-one manner. Further, each of the plurality of storage capacitors 244 is electrically coupled to the drain of each of the plurality of transistors 240 in a one-to-one manner. Each the storage capacitor 244 is a capacitance element for holding potential of the pixel electrode 220.

When the scanning signals G1, G2, . . . , and Gn become sequentially active and the n scanning lines 241 are sequentially selected, the transistor 240 coupled to the selected scanning line 241 is turned to be on-state. Then, the image signals S1, S2, . . . , and Sm having magnitude commensurate with grayscale to be displayed via the m signal lines 242, respectively, are each captured by the pixel P corresponding to the selected scanning line 241, and are then each applied to the pixel electrode 220. This allows a voltage in accordance with the grayscale to be displayed to be applied to a liquid crystal capacitor formed between the pixel electrode 220 and the common electrode 330 included in the counter substrate 300 illustrated in FIG. 2, where alignment of liquid crystal molecules varies in accordance with the applied voltage. Further, the applied voltage is held by the storage capacitor 244. Such a variation in the alignment of the liquid crystal molecules causes light to be modulated, to thus enable grayscale display.

1A-3. Element Substrate 200

Figure 4:
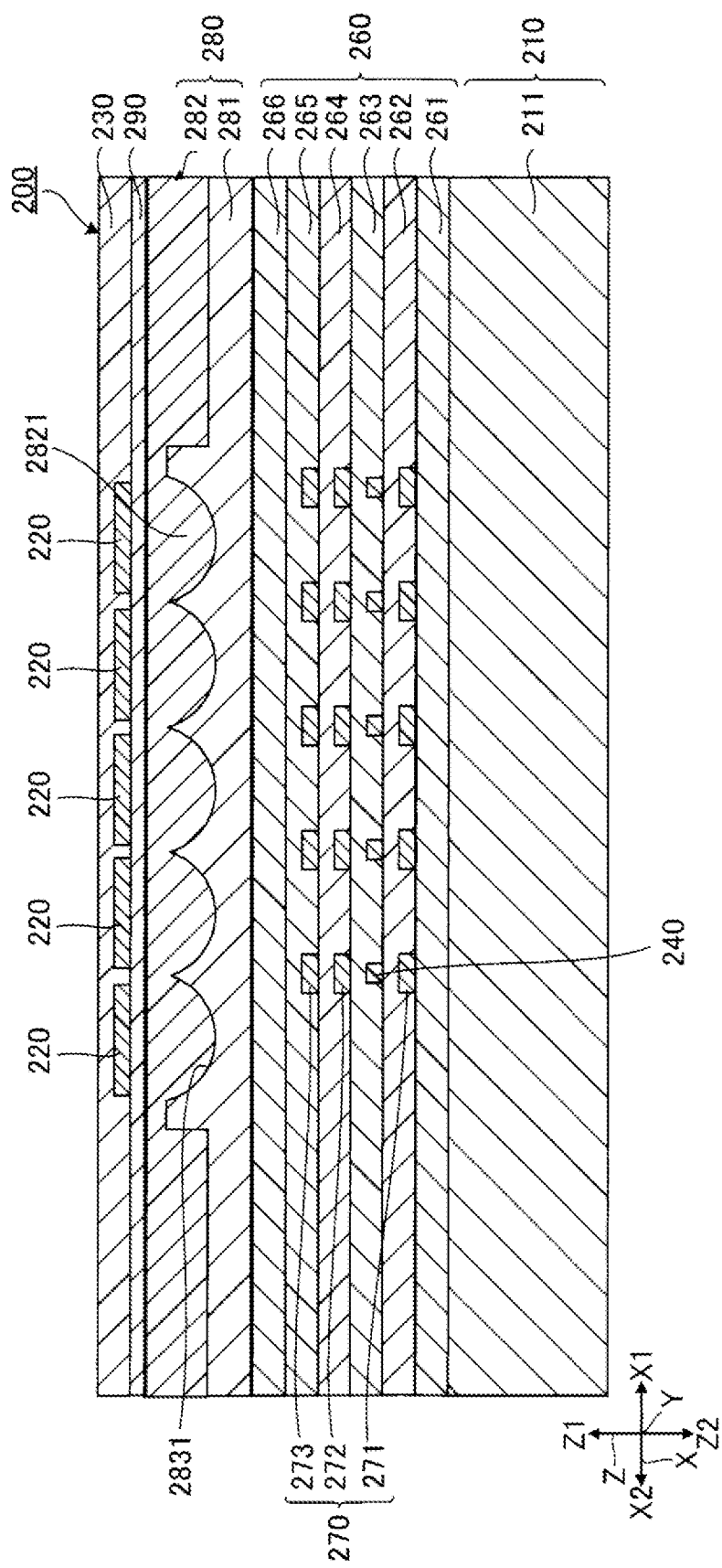
FIG. 4 is a cross-sectional view of the element substrate.

FIG. 4 is a cross-sectional view of the element substrate 200 taken along a line B-B in FIG. 1. Note that, FIG. 4 is schematically illustrated for ease of understanding a configuration of each unit. In the following description, the Z1 direction is described as being an upward direction and the Z2 direction as being a downward direction.

As illustrated in FIG. 4, the element substrate 200 includes, in addition to the first base body 210, the plurality of pixel electrodes 220, the first alignment film 230, and the plurality of transistors 240 described above, a laminate 260, a light-shielding body 270, a first lens structure 280, and a protective film 290. The first base body 210, the laminate 260, the first lens structure 280, the protective film 290, the plurality of pixel electrodes 220, and the first alignment film 230 are stacked in this order. Thus, each of the plurality of transistors 240 and the light-shielding bodies 270 is disposed between a base member 211 and the first lens structure 280. Moreover, each of the plurality of transistors 240 and the light-shielding bodies 270 is disposed between layers of the laminate 260. Hereinafter, parts of the element substrate 200 will be described sequentially.

As described above, the first base body 210 is formed of a flat plate being transmissive and having insulating properties. The first base body 210 illustrated in FIG. 4 has the base member 211. The base member 211 is formed of, for example, glass, quartz, or the like. Note that, for example, a protective film formed of a silicon oxynitride film, a silicon oxide film, or the like may be disposed on a surface of the base member 211 on a side of the Z1 direction.

The laminate 260 is transmissive and has insulating properties. The laminate 260 includes interlayer insulating films 261, 262, 263, 264, 265 and 266. The interlayer insulating films 261, 262, 263, 264, 265 and 266 are stacked in this order from the first base body 210 toward the first lens structure 280. Each of the interlayer insulating films 261, 262, 263, 264, 265 and 266 is formed of an inorganic material containing silicon such as silicon oxide, for example. Each of the plurality of transistors 240 and the light-shielding bodies 270 is disposed appropriately between the layers of the laminate 260.

In the example illustrated in FIG. 4, the transistor 240 is disposed between the interlayer insulating film 262 and the interlayer insulating film 263. Also, although not illustrated, each of the plurality of scanning lines 241, the plurality of signal lines 242, the plurality of capacitance lines 243, and the plurality of storage capacitors 244 is appropriately disposed between the layers of the laminate 260. Moreover, in each the layer of the 260 laminate, a structure such as the transistor 240, the scanning line 241, the signal line 242, the capacitance line 243, or a through-electrode electrically coupled to the storage capacitor 244 is appropriately disposed so as to penetrate therethrough. Note that, the number of layers constituting the laminate 260 is not limited to the number of layers illustrated in FIG. 4, and is optional. In addition, in FIG. 4, the laminate 260 is provided across a light-passing region, but the light-passing region may be formed of a layer separate from the laminate 260.

The light-shielding body 270 is an aggregate of films having a light shielding property disposed between the layers of the laminate 260. Although not illustrated, the light-shielding bodies 270 are disposed in a lattice so as to surround the pixel electrode 220 in plan view. The light-shielding body 270 has light-shielding films 271, 272 and 273. The light-shielding film 271 is disposed between the interlayer insulating film 261 and the interlayer insulating film 262. The light-shielding film 272 is disposed between the interlayer insulating film 263 and the interlayer insulating film 264. The light-shielding film 273 is disposed between the interlayer insulating film 264 and the interlayer insulating film 265.

Here, the transistor 240 is disposed in the Z1 direction with respect to the light-shielding film 271. Accordingly, entrance of light traveling in the Z1 direction or other outside light to the transistor 240 can be reduced or prevented by the light-shielding film 271. Further, the transistor 240 is disposed in the Z2 direction with respect to the light-shielding film 272 or 273. Accordingly, entrance of outside light traveling in the Z2 direction to the transistor 240 can also be reduced or prevented by the light-shielding film 272 or 273. Each of the light-shielding films 271, 272 and 273 is formed of metal, a metal silicide, a metal compound, or the like, for example. Examples of the metal include tungsten (W), titanium (Ti), chromium (Cr), iron (Fe), aluminum (Al), and the like.

When being conductive, the light-shielding film 271, 272 or 273 may also serve as the above-described scanning line 241, signal line 242, or capacitance line 243, or may also serve as an electrode of the storage capacitor 244. In other words, the light-shielding film 271, 272 or 273 may be a wiring line. In a case of a wiring line, each of the light-shielding films 271, 272 and 273 may include aluminum. Accordingly, resistance of the wiring line can be lowered.

The first lens structure 280 is a lens array for adjusting a spread angle of light for each the pixel P. The first lens structure 280 of the present exemplary embodiment adjusts a spread angle of light so as to fall within a desired range for each the pixel P. By an action of the first lens structure 280, an amount of light transmitted through the liquid crystal layer 500 can be increased. Thus, light utilization efficiency can be improved. Note that, the first lens structure 280 will be described in detail below.

The protective film 290 is a film disposed on a surface opposite to the laminate 260 of the first lens structure 280, and being transmissive and having insulating properties. The protective film 290 is formed of, for example, a silicon nitride film, a silicon oxide film, or the like. By disposing the protective film 290 on the first lens structure 280, occurrence of cracks or the like in the first lens structure 280 during manufacturing of the element substrate 200 can be reduced, or flatness of the pixel electrode 220 can be improved compared to a case where the protective film 290 is not used. Note that, the protective film 290 may be formed of, for example, glass such as borosilicate glass (BSG) from a perspective of enhancing adhesion to the pixel electrode 220.

The plurality of pixel electrodes 220 are disposed on a surface opposite to the first lens structure 280 in the protective film 290. In plan view, the plurality of pixel electrodes 220 are disposed in a matrix corresponding to the pixels P. Although not illustrated, each of the plurality of pixel electrodes 220 is electrically coupled to the drain of the transistor 240, via a through-electrode that penetrates the first lens structure 280 and the protective film 290 described above. The first alignment film 230 is disposed on respective surfaces of the plurality of pixel electrodes 220 opposite to the protective film 290. Note that, it is sufficient that the protective film 290 is provided as necessary, or the protective film 290 may be omitted. In this case, the plurality of pixel electrodes 220 are disposed directly on the first lens structure 280.

1A-4. First Lens Structure 280

Figure 5:
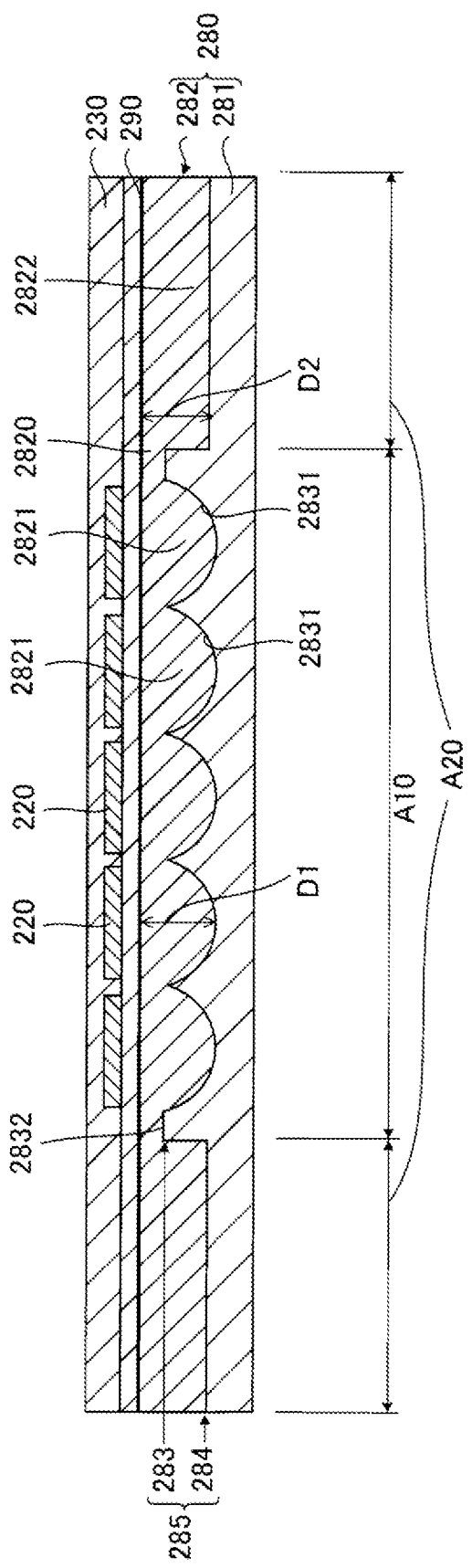
FIG. 5 is a cross-sectional view of a first lens structure included in the element substrate.
Figure 6:
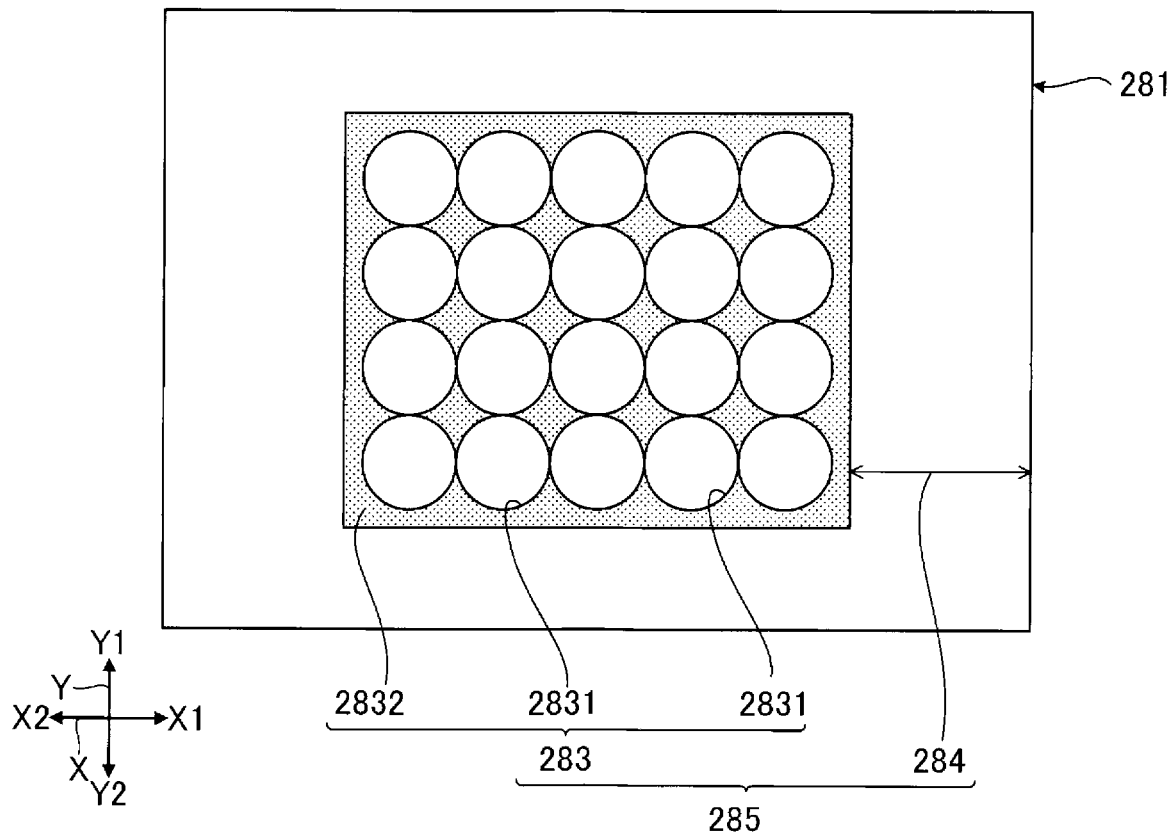
FIG. 6 is a plan view of a light-transmitting layer included in the first lens structure.

FIG. 5 is a cross-sectional view illustrating the first lens structure 280. FIG. 6 is plan view illustrating a light-transmitting layer 281 included in the first lens structure 280. As illustrated in FIG. 5, the first lens structure 280 includes the light-transmitting layer 281 and a lens layer 282. The light-transmitting layer 281 is an example of an "insulating layer" disposed between the base member 211 and the lens layer 282 illustrated in FIG. 4.

As illustrated in FIG. 5, the light-transmitting layer 281 is a layer being transmissive and having insulating properties. The light-transmitting layer 281 is formed of an inorganic material containing silicon such as silicon oxide, for example. The light-transmitting layer 281 has a contact surface 285 that contacts the lens layer 282. The contact surface 285 has a first surface 283 located in the display area A10 and a second surface 284 located in the peripheral area A20.

The first surface 283 has a plurality of recessed portions 2831. The recessed portion 2831 is an example of a "first recessed portion". Each the recessed portion 2831 is a curved depression formed in the first surface 283. As illustrated in FIG. 6, the plurality of recessed portions 2831 are arranged in a matrix corresponding to the plurality of pixels P in plan view. Note that, in FIG. 6, for convenience, a portion 2832 of the first surface 283 other than the plurality of recessed portions 2831 is given a dot pattern. As illustrated in FIG. 5, the plurality of recessed portions 2831 are disposed corresponding to the plurality of pixel electrodes 220 in a one-to-one manner.

The second surface 284 has a recessed portion. The recessed portion is an example of a "second recessed portion". In particular, in the present exemplary embodiment, the second surface 284 is formed of the recessed portion. That is, the second surface 284 is located in the Z2 direction with respect to the portion 2832 of the first surface 283. Thus, the second surface 284 is closer to the base member 211 than the portion 2832 other than the plurality of recessed portions 2831 of the first surface 283. The second surface 284 is a flat surface and is a depression formed in the light-transmitting layer 281. As illustrated in FIG. 6, a shape of the second surface 284 in plan view is formed in a frame shape surrounding the first surface 283. From another perspective, the shape of the second surface 284 in plan view is formed in a frame shape surrounding the plurality of recessed portions 2831.

In the example illustrated in FIG. 5, a depth D2 of the recessed portion constituting the second surface 284 is smaller than a depth D1 of each the recessed portion 2831. Each of the depths D1 and D2 is a length along the Z-axis. The depth D1 is a distance along the Z-axis from the portion 2832 to a bottom of the recessed portion 2831. The depth D2 is a distance along the Z-axis from the portion 2832 to the bottom of the recessed portion 2831. Note that, the depth D2 may be equal to or larger than depth D1.

As illustrated in FIG. 5, the lens layer 282 is disposed on the light-transmitting layer 281 so as to fill an inside of the plurality of recessed portions 2831. The lens layer 282 is a layer formed of a material having a refractive index different from a refractive index of a material of the light-transmitting layer 281, and is light-transmissive and has insulating properties. The refractive index of the lens layer 282 may be larger than the refractive index of the light-transmitting layer 281. Examples of a constituent material for the lens layer 282 include, for example, inorganic material including silicon such as silicon oxynitride. Note that, when the lens layer 282 is formed of the inorganic material, the lens layer 282 can be formed to have excellent optical properties and to be sufficiently thin compared to a case of being formed of a resin material.

The lens layer 282 includes a flat plate shaped flat plate portion 2820, a plurality of lenses 2821, and a peripheral convex portion 2822. Each the lens 2821 protrudes from the flat plate portion 2820 in the Z2 direction. The plurality of lenses 2821 are disposed corresponding to the plurality of recessed portions 2831. Specifically, the plurality of lenses 2821 are disposed corresponding to the plurality of recessed portions 2831 in a one-to-one manner. Thus, the plurality of lenses 2821 are disposed corresponding to the plurality of pixel electrodes 220. Each the lens 2821 has a curved surface that functions as a lens surface. The lens surface contacts the recessed portion 2831. The peripheral convex portion 2822 protrudes in the Z2 direction from the flat plate portion 2820. The peripheral convex portion 2822 contacts the second surface 284 of the light-transmitting layer 281. Although not illustrated, a shape of the peripheral convex portion 2822 in plan view is a frame shape surrounding the plurality of lenses 2821.

As described above, the light-transmitting layer 281 includes the contact surface 285. The first surface 283 included in the contact surface 285 includes the plurality of recessed portions 2831 disposed corresponding to the plurality of lenses 2821. Further, the second surface 284 included in the contact surface 285 is formed of the recessed portion, and is recessed in the Z2 direction with respect to the portion 2832 of the first surface 283.

The second surface 284 is recessed with respect to the portion 2832 of the first surface 283, thus a global step of the lens layer 282 can be mitigated as compared to a case of not being recessed. In particular, the global step can be mitigated regardless of an effect of warping of the element substrate 200. By mitigating the global step, it is possible to improve evenness of distance between the element substrate 200 and the counter substrate 300. Note that, the global step is a step formed at a boundary between a portion of the display area A10 and a portion of the peripheral area A20 of an upper surface of the lens layer 282. The global step will be described in more detail below.

In addition, as described above, when the refractive index of the material of the lens layer 282 is larger than the refractive index of the material of the light-transmitting layer 281, and the lens layer 282 is formed as a film, then the warping of the element substrate 200 is particularly easy to occur. However, as described above, since the light-transmitting layer 281 includes the second surface 284, the global step can be mitigated regardless of the effect of the warping.

Additionally, as described above, the light-transmitting layer 281 and the lens layer 282 are disposed between the plurality of transistors 240 and the plurality of pixel electrodes 220. The lens layer 282 is disposed as an upper layer than the laminate 260. When the lens layer 282 is formed as a film, warping occurs in the element substrate 200 due to residual stress in the lens layer 282. The warping is mitigated by annealing, but when the annealing is performed on the lens layer 282, there is a possibility that the plurality of transistors 240 and various wiring lines disposed in lower layers than the lens layer 282 are damaged. This is because, a temperature during the annealing is typically higher than a heat resistance limit temperature which is a temperature at which physical properties of the wiring line change. Thus, application of the annealing is not appropriate to the lens layer 282. When the warping of the element substrate 200 is not suppressed, it is difficult to mitigate the global step by a flattening process. However, as described above, since the light-transmitting layer 281 includes the second surface 284, the global step can be mitigated regardless of the effect of the warping. Thus, a configuration in which the light-transmitting layer 281 located at a higher layer than the plurality of transistors 240 has the second surface 284 formed of the recessed portion is more effective than a configuration in which the base member 211 located at a lower layer than the plurality of transistors 240 includes the second surface 284.

1A-5. Manufacturing Method of Electro-Optical Device 100

Figure 7:
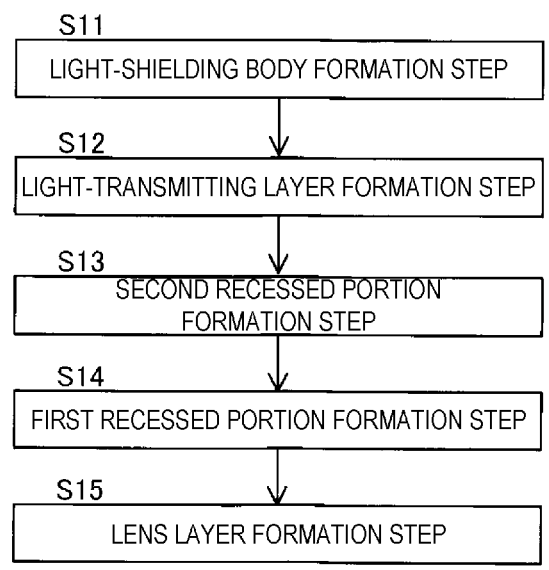
FIG. 7 is a diagram illustrating a flow of a manufacturing method of the electro-optical device according to the first exemplary embodiment.

FIG. 7 is a diagram illustrating a flow of a manufacturing method of the electro-optical device 100 according to the first exemplary embodiment. In FIG. 7, among manufacturing steps of the electro-optical device 100, manufacturing steps of the first lens structure 280 are illustrated representatively. Note that, structure of the electro-optical device 100 other than the first lens structure 280 can be manufactured by a known method. Also, an expression "element B is formed at element A" in the present specification is not limited to a case where the element A and the element B are in direct contact with each other. Even a case where the element A and the element B are not in direct contact with each other is also included in the concept "element B is formed at element A". Hereinafter, the element substrate 200 in the middle of being manufactured is also described as the element substrate 200. For example, a structure that does not include the protective film 290, the plurality of pixel electrodes 220, and the first alignment film 230 may be described as the element substrate 200.

As illustrated in FIG. 7, the manufacturing method of the electro-optical device 100 includes a light-shielding body formation step S11, a light-transmitting layer formation step S12, a second recessed portion formation step S13, a first recessed portion formation step S14, and a lens layer formation step S15. Each of the steps will be orderly described below.

Figure 8:
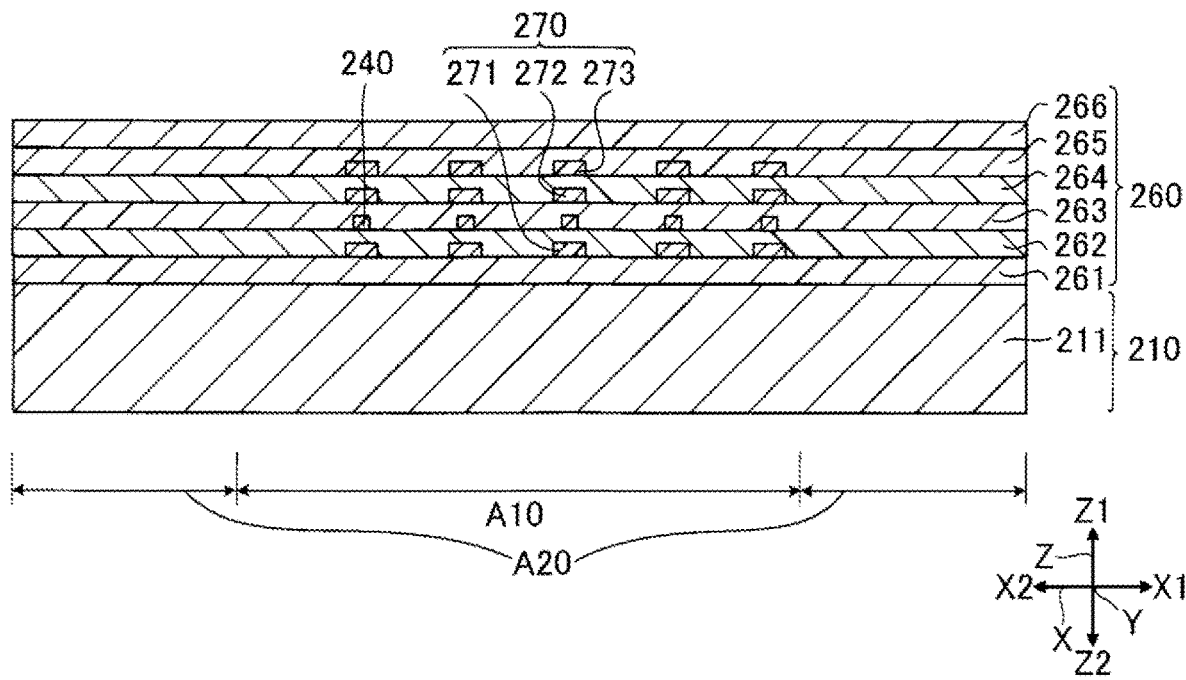
FIG. 8 is a cross-sectional view for explaining a light-shielding body formation step.

FIG. 8 is a cross-sectional view for explaining the light-shielding body formation step S11. In the light-shielding body formation step S11, as illustrated in FIG. 8, the light-shielding body 270 and the plurality of transistors 240 are formed. In addition, the laminate 260 is formed together with the light-shielding body 270. Each of the light-shielding films 271 to 273 included in the light-shielding body 270 is formed by, for example, forming a metal film by a sputtering method or a vapor deposition method, and then etching using a resist mask is performed on the metal film. Each of the interlayer insulating films 261 to 266 included in the laminate 260 is formed by thermal oxidation or chemical vapor deposition (CVD), for example.

Figure 9:
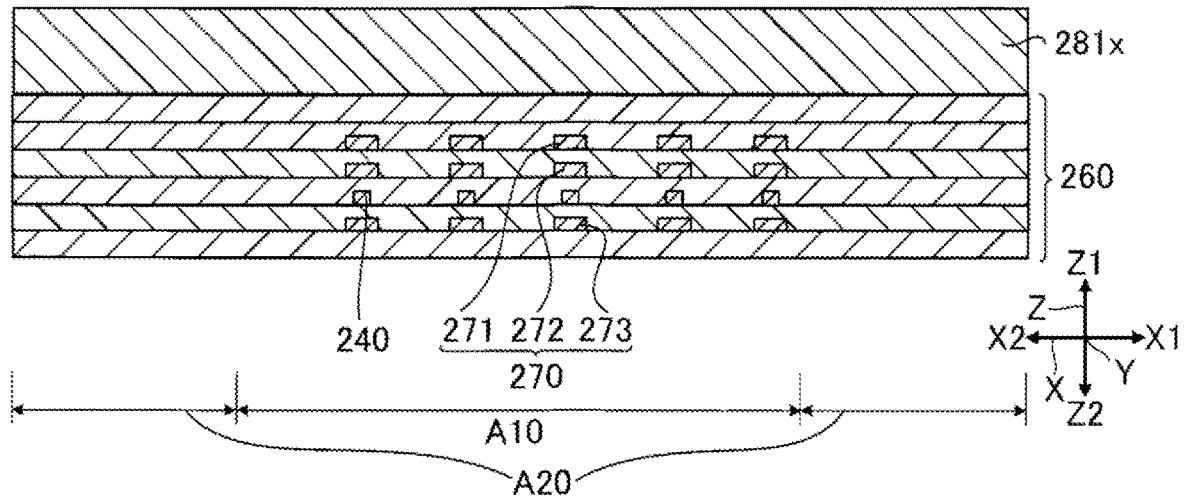
FIG. 9 is a cross-sectional view for explaining a light-transmitting layer formation step.

FIG. 9 is a cross-sectional view for explaining the light-transmitting layer formation step S12. Note that, in FIG. 9, an illustration of lower layers than the laminate 260 is omitted. In the light-transmitting layer formation step S12, as illustrated in FIG. 9, a light-transmitting layer 281$x$ is formed at the laminate 260. The light-transmitting layer 281$x$ becomes the light-transmitting layer 281 of the first lens structure 280 after being subjected to subsequent steps. The light-transmitting layer 281$x$ is formed of, for example, an inorganic material such as silicon oxide. A vapor deposition method such as a CVD method, for example, is used to form the light-transmitting layer 281$x$. For example, tetraethoxysilane (TEOS) or $SiH_4$ is used as a raw material gas. Furthermore, as necessary, the light-transmitting layer 281$x$ is subjected to a flattening process using a chemical mechanical polishing (CMP) method or the like.

Figure 10:
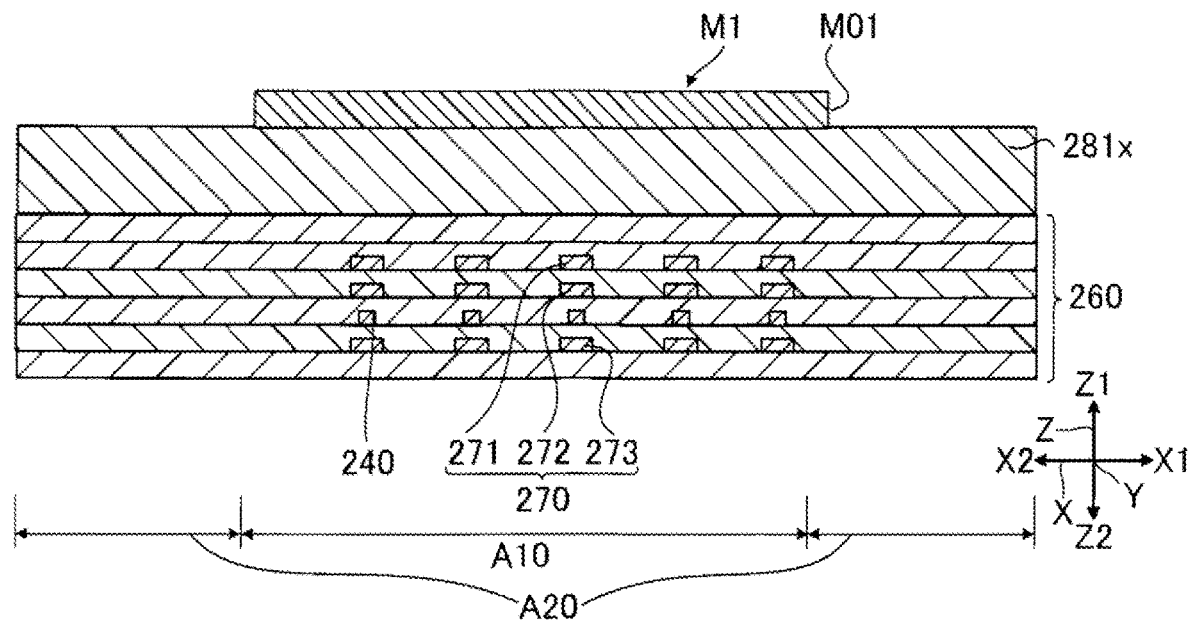
FIG. 10 is a cross-sectional view for explaining a second recessed portion formation step.
Figure 11:
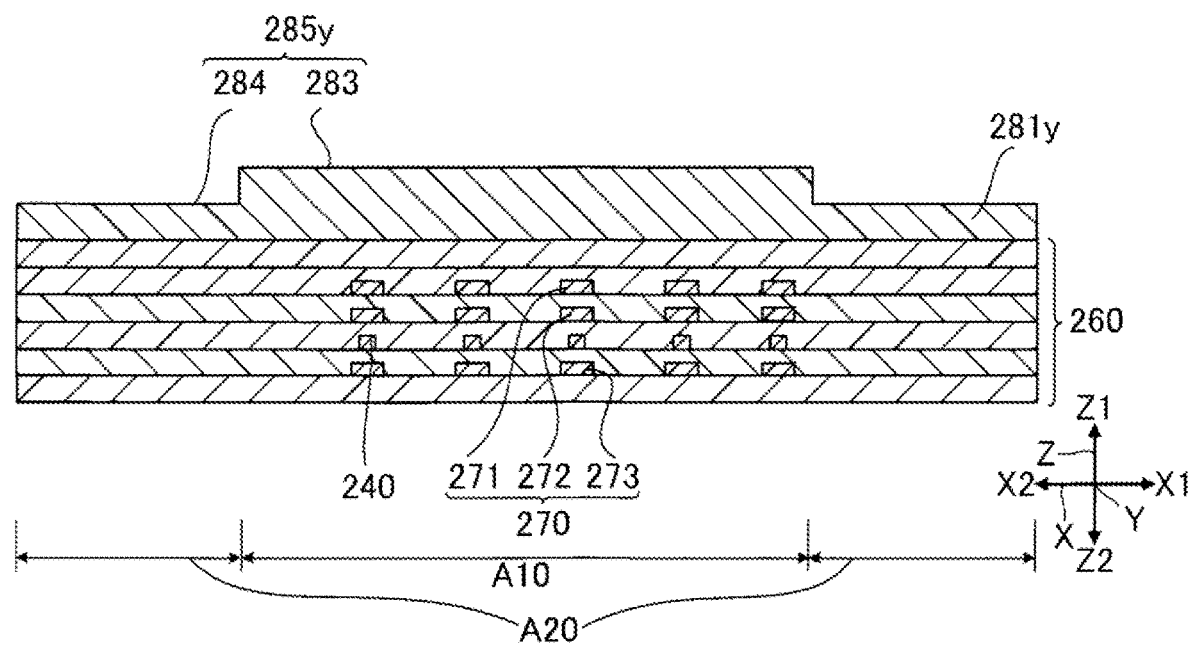
FIG. 11 is a cross-sectional view for explaining the second recessed portion formation step.

Each of FIG. 10 and FIG. 11 is a cross-sectional view for explaining the second recessed portion formation step S13. In the second recessed portion formation step S13, first, as illustrated in FIG. 10, a mask M1 is formed at the light-transmitting layer 281$x$. Thereafter, a part of the light-transmitting layer 281$x$ is removed by etching using the mask M1. With this removal, as illustrated in FIG. 11, a light-transmitting layer 281$y$ is formed.

Specifically, for example, by applying a resist material to the light-transmitting layer 281$x$, and exposing and developing the resist material, the mask M1 is formed. The mask M1 has an opening M01. The opening M01 is provided at a position corresponding to the peripheral area A20. After the mask M1 is formed, as illustrated in FIG. 11, a part of a portion of the light-transmitting layer 281$y$ that is not covered by the mask M1 is removed. The part of the light-transmitting layer 281$x$ is removed by dry etching, such as reactive ion etching (RIE). For example, a fluorocarbon type gas such as $CF_4$ is used as an etching gas. In addition, by the etching, the part of the light-transmitting layer 281$x$ is removed, and the mask M1 is removed. Note that, the removal of the part of the light-transmitting layer 281$x$ and the removal of the mask M1 may be performed in separate steps, respectively. For example, the mask M1 may be removed by asking with plasma or ozone. Note that, the mask M1 may be formed of a metal film.

As illustrated in FIG. 11, an upper surface 285$y$ of the light-transmitting layer 281$y$ includes the first surface 283 located in the display area A10, and the second surface 284 located in the peripheral area A20. The second surface 284 included in the light-transmitting layer 281$y$ is recessed toward the laminate 260 with respect to the first surface 283. Thus, the second surface 284 is located in the Z2 direction with respect to the first surface 283. Note that, the upper surface 285$y$ is to contact the lens layer 282 in a subsequent step. That is, the upper surface 285$y$ is the contact surface 285 that contacts the lens layer 282.

Figure 12:
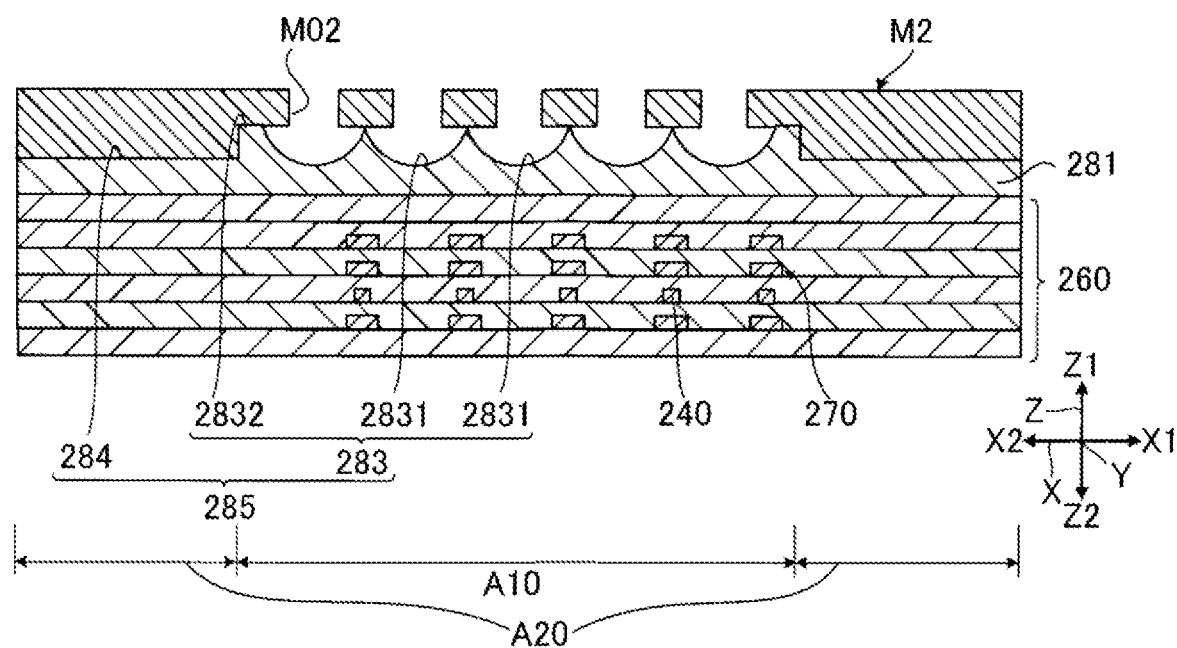
FIG. 12 is a cross-sectional view for explaining a first recessed portion formation step.

FIG. 12 is a cross-sectional view for explaining the first recessed portion formation step S14. In the first recessed portion formation step S14, as illustrated in FIG. 12, the light-transmitting layer 281 having the plurality of recessed portions 2831 is formed. Specifically, first, a mask M2 illustrated in FIG. 12 is formed at the light-transmitting layer 281$y$ illustrated in FIG. 11. Next, by removing parts of the light-transmitting layer 281$y$ illustrated in FIG. 11 by etching using the mask M2, the light-transmitting layer 281 illustrated in FIG. 12 is formed.

The mask M2 has a plurality of openings M02. Each the opening M02 is located in the display area A10. The mask M2 is, for example, a hard mask that can be formed as a film at such a low temperature that transmutation or the like of the light-shielding body 270 does not occur. The mask M2 includes, for example, tungsten silicide (WSi) or titanium nitride (TiN). A portion of the light-transmitting layer 281$y$ that is not covered by the mask M1 is etched isotropically, to form the plurality of recessed portions 2831 that are each substantially hemispherical in the first surface 283 of the light-transmitting layer 281$y$. Examples of the etching include, for example, wet etching using a fluorine-based etchant such as hydrogen fluoride (HF). Note that, after the light-transmitting layer 281 illustrated in FIG. 12 is formed, the mask M2 is removed.

Figure 13:
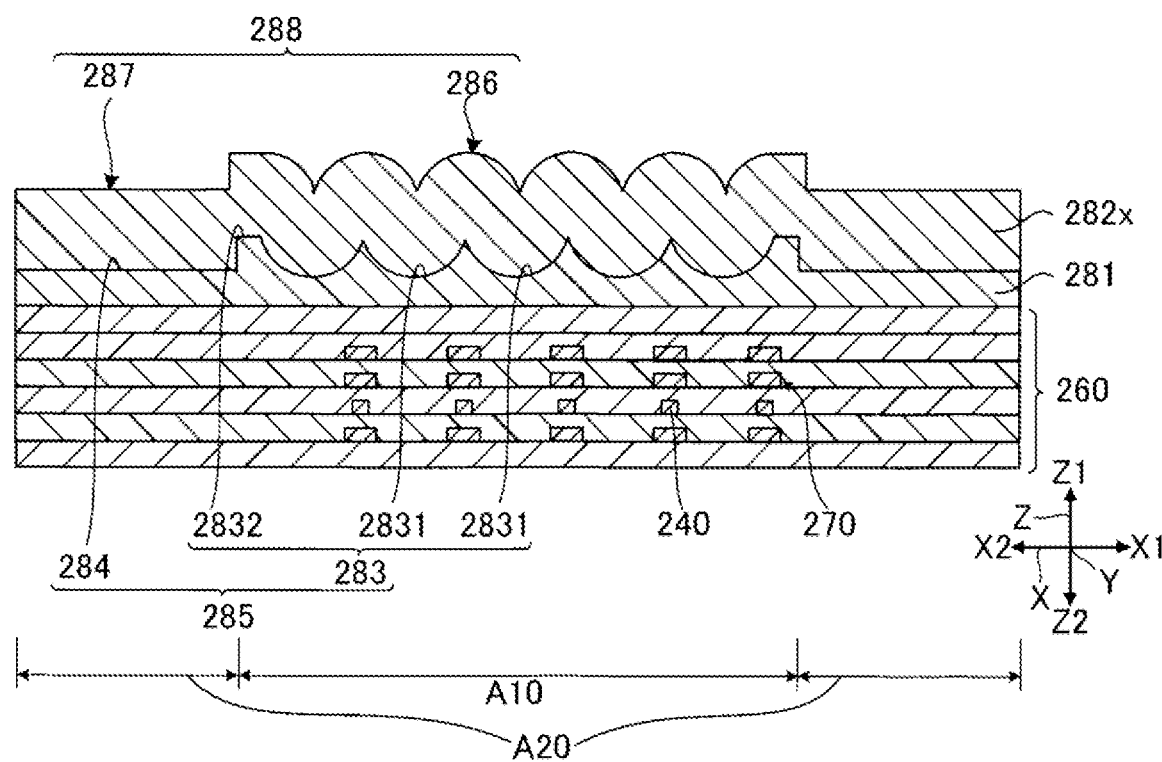
FIG. 13 is a cross-sectional view for explaining a lens layer formation step.
Figure 14:
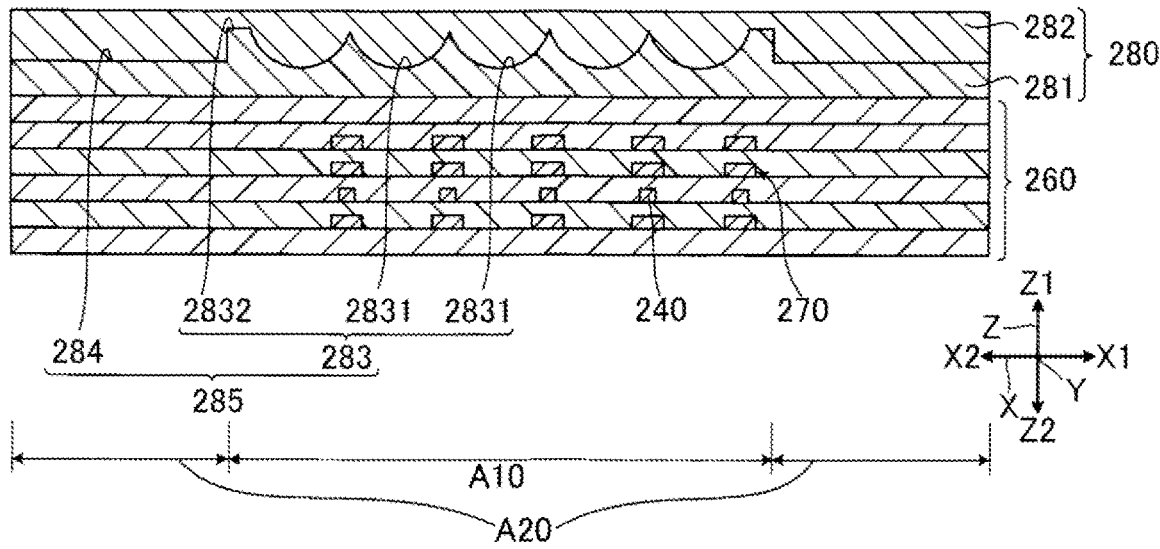
FIG. 14 is a cross-sectional view for explaining the lens layer formation step.

Each of FIG. 13 and FIG. 14 is a cross-sectional view for explaining the lens layer formation step S15. In the lens layer formation step S15, first, as illustrated in FIG. 13, a lens layer 282$x$ is formed at the light-transmitting layer 281. Next, the lens layer 282$x$ is subjected to a flattening process by polishing, such as a CMP method. As a result, as illustrated in FIG. 14, the lens layer 282 is produced.

The lens layer 282$x$ illustrated in FIG. 13 is formed of, for example, an inorganic material such as silicon oxide or the like. A vapor deposition method such as a CVD method, for example, is used to form the lens layer 282$x$. For example, TEOS or $SiH_4$ is used as a raw material gas. Further, unevenness of the light-transmitting layer 281 is reflected to an upper surface 288 of the lens layer 282$x$. Specifically, the upper surface 288 of the lens layer 282$x$ has a third surface 286 located in the display area A10 and a fourth surface 287 located in the peripheral area A20. The third surface 286 is a portion corresponding to the first surface 283. The third surface 286 has unevenness that reflects a shape of the plurality of recessed portions 2831. The fourth surface 287 is a portion corresponding to the second surface 284. The fourth surface 287 is recessed in the Z2 direction with respect to a protruding portion of the third surface 286. In order to flatten the unevenness of the upper surface 288 of the lens layer 282$x$, a flattening process is performed by polishing such as a CMP method. As a result, the upper surface 288 of the lens layer 282$x$ is flattened, and the lens layer 282 illustrated in FIG. 14 is obtained.

As described above, the first lens structure 280 is obtained. As described above, the light-transmitting layer 281$y$ that is the "insulating layer" including the second surface 284 is formed, and then the plurality of recessed portions 2831 are formed in the first surface 283 of the light-transmitting layer 281$y$. As a result, the light-transmitting layer 281 is obtained. Next, the lens layer 282$x$ is formed at the light-transmitting layer 281, and then the flattening process is performed on the lens layer 282$x$. By forming the lens layer 282$x$ as a film at the light-transmitting layer 281 having the second surface 284, the fourth surface 287 of the lens layer 282$x$ is brought into a state of being recessed toward the base member 211 with respect to the third surface 286. By performing the flattening process on the upper surface 288 of the lens layer 282$x$, a global step can be mitigated without being affected by warping.

Figure 15:
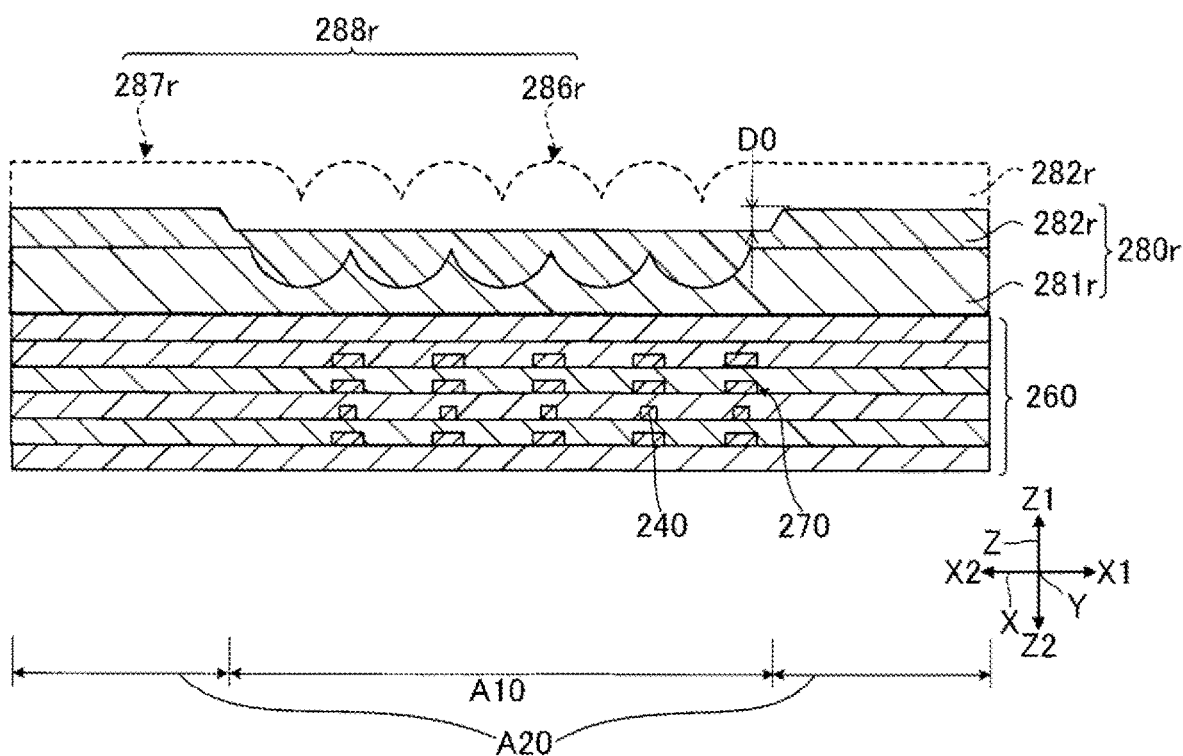
FIG. 15 is a cross-sectional view for explaining a lens structure of a reference example.

FIG. 15 is a cross-sectional view for explaining a lens structure 280r of a reference example. As illustrated in FIG. 15, the lens structure 280r includes a light-transmitting layer 281r and a lens layer 282r. The lens layer 282r denoted by a dashed line in FIG. 15 is in a state before a flattening process. The lens layer 282r denoted by a solid line in FIG. 15 is in a state after the flattening process. The light-transmitting layer 281r does not have a portion corresponding to the second surface 284 of the present exemplary embodiment. For this reason, there is unevenness that reflects a shape of a plurality of recessed portions of the light-transmitting layer 281r on a surface 286r located in the display area A10 of an upper surface 288r of the lens layer 282r denoted by a dashed line, and there is no unevenness in a surface 287r located in the peripheral area A20. Thus, density of the surface 286r is smaller than density of the surface 287r. Thus, the surface 286r is more likely to be polished more deeply than the surface 287r. As a result, a step D0 between the surface 286r and the surface 287r tends to increase in the lens layer 282r. The step D0 is a so-called global step.

Here, as described above, the light-transmitting layer 281 of the present exemplary embodiment has the second surface 284 that is recessed in the Z2 direction with respect to the first surface 283, as illustrated in FIG. 13. Additionally, a shape of the contact surface 285 of the light-transmitting layer 281 is reflected to the upper surface 288 of the lens layer 282x formed as a film at the light-transmitting layer 281. Thus, the fourth surface 287 located in the peripheral area A20 of the lens layer 282x is located in the Z2 direction with respect to the third surface 286 located in the display area A10. By recessing the fourth surface 287 of the upper surface 288 in advance, before the flattening process on the lens layer 282x, the third surface 286 is prevented from being deeply polished compared to the fourth surface 287. In other words, by forming the fourth surface 287 before the flattening process on the lens layer 282x, it is possible to suppress formation of a global step. Furthermore, even when a global step is formed, a size thereof can be reduced.

In addition, when the lens layer 282x is formed as a film, warping of the element substrate 200 due to residual stress in the lens layer 282x occurs. For example, the element substrate 200 warps such that a portion of the display area A10 is recessed in the Z2 direction in some cases. Even in this case, since the second surface 284 is present, the flattening process can be performed without being affected by the warping.

Figure 16:
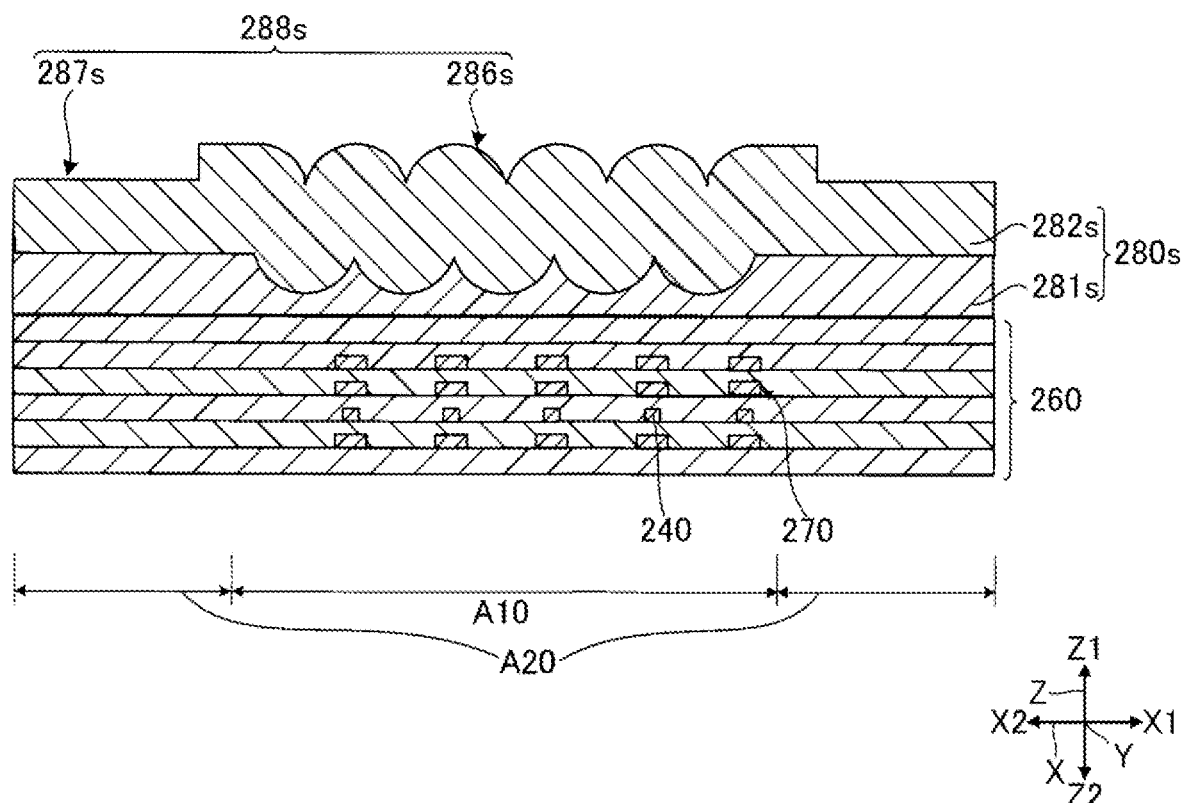
FIG. 16 is a cross-sectional view for explaining a lens structure of a reference example.

FIG. 16 is a cross-sectional view for explaining a lens structure 280s of a reference example. As illustrated in FIG. 16, the lens structure 280s has a light-transmitting layer 281s and a lens layer 282s. For example, to mitigate a global step, it is conceivable to recess a surface 287s located in the peripheral area A20 of an upper surface 288s of the lens layer 282s with respect to a surface 286s located in the display area A10. For example, with etching using a mask, the surface 287s located in the peripheral area A20 can be removed. However, when warping is caused by the residual stress described above, it is difficult to perform etching with high accuracy due to a constraint by the warping. As a result, as illustrated in FIG. 16, it may be difficult to recess the surface 287s with respect to the surface 286s.

Compared to this, the light-transmitting layer 281 has the second surface 284 that is recessed in the Z2 direction with respect to the first surface 283, as illustrated in FIG. 13. Then, the lens layer 282x is formed at the light-transmitting layer 281. Thus, the fourth surface 287 of the lens layer 282x can be recessed with respect to the third surface 286 even without etching the lens layer 282x. Thus, a global step can be suppressed without being affected by warping caused by the residual stress described above.

1B. Second Exemplary Embodiment

A second exemplary embodiment will be described. Note that, in each of the following examples, a sign used in the description of the first exemplary embodiment is used for the same element as that of the first exemplary embodiment, and each detailed description thereof will be appropriately omitted.

Figure 17:
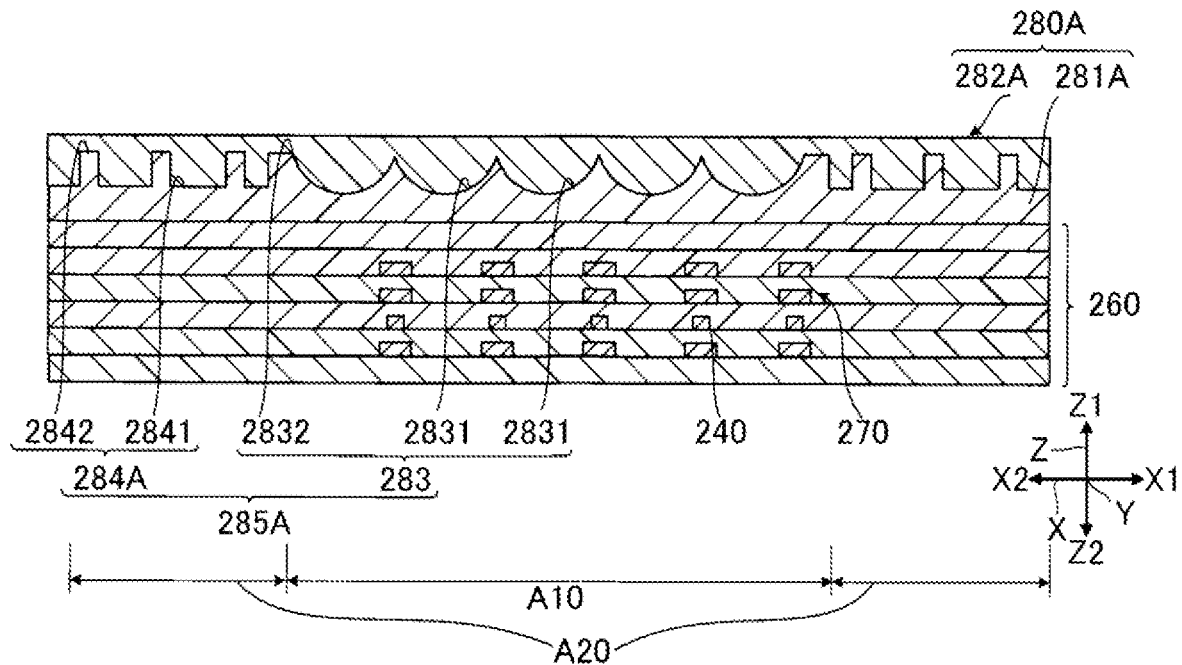
FIG. 17 is a cross-sectional view of a first lens structure in a second exemplary embodiment.
Figure 18:
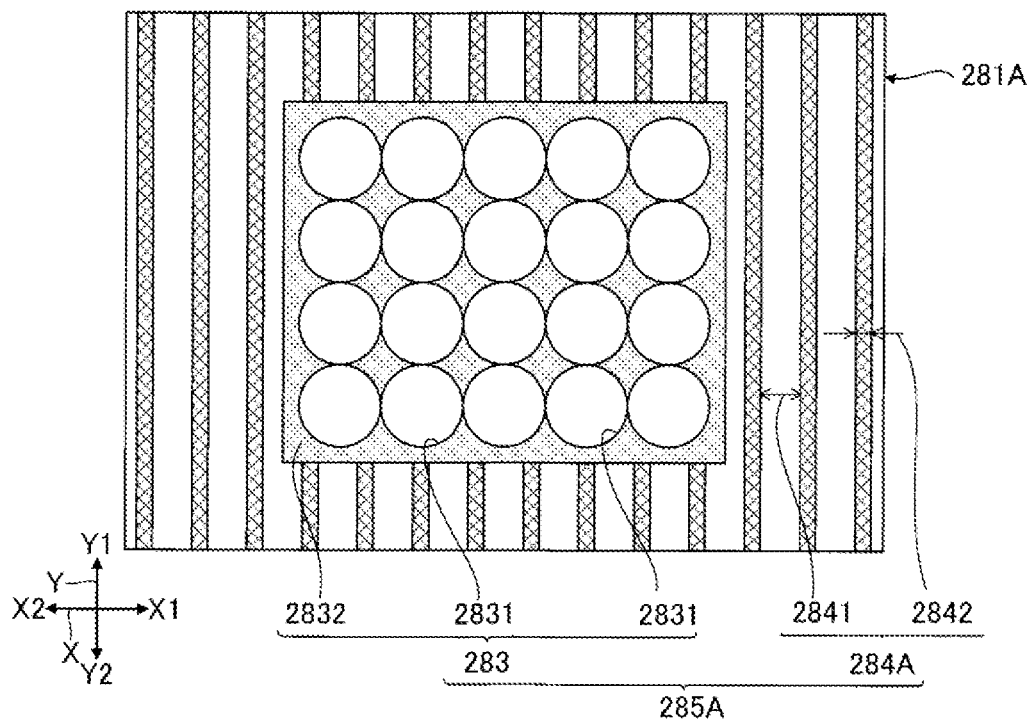
FIG. 18 is a plan view of a light-transmitting layer included in the first lens structure illustrated in FIG. 17.

FIG. 17 is a cross-sectional view of a first lens structure 280A in the second exemplary embodiment. FIG. 18 is plan view of a light-transmitting layer 281A included in the first lens structure 280A illustrated in FIG. 17. The first lens structure 280A differs from the first lens structure 280 in the first exemplary embodiment in a shape of a contact surface 285A included in the light-transmitting layer 281A. Note that, in FIG. 18, for convenience, the portion 2832 of the first surface 283 other than the plurality of recessed portions 2831 is given a dot pattern. Additionally, a convex portion 2842 described below is shaded.

As illustrated in FIG. 17, a second surface 284A of the light-transmitting layer 281A includes a plurality of recessed portions 2841. Each the recessed portion 2841 is an example of a "second recessed portion". As illustrated in FIG. 18, each the recessed portion 2841 is a groove extending along a Y-axis. The recessed portions 2841 are spaced at equal intervals from each other. The plurality of recessed portions 2841 are arranged along an X-axis. From another perspective, portions of the second surface 284A obtained by excluding the plurality of recessed portions 2841 constitute a plurality of convex portions 2842.

Disposal density of the plurality of recessed portions 2831 in the first surface 283 and a density of the plurality of recessed portions 2841 disposed in the second surface 284A may be equal. From another perspective, a density of the portion 2832 disposed in the first surface 283 excluding the plurality of recessed portions 2831, and a density of the plurality of convex portions 2842 disposed in the second surface 284A may be equal. Note that, the "equal" here means substantially equal. Specifically, the "equal" includes not only a state where densities of two portions disposed completely match each other, but also a state where a difference between the two is within 5%.

Since the density of the plurality of recessed portions 2831 disposed and the density of the plurality of recessed portions 2841 disposed are equal to each other, a difference in density between the first surface 283 and the second surface 284A can be minimized. Thus, a difference in density between the third surface 286 and the fourth surface 287 of the lens layer 282x illustrated in FIG. 13 can be minimized. Thus, a global step can be particularly effectively mitigated.

Here, for example, it is conceivable that as a shape of the recessed portion 2841 of the second surface 284A, a curved shape identical to a shape of the recessed portion 2831 of the first surface 283 is adopted. In other words, it is conceivable to form the plurality of recessed portions 2831 that are a plurality of hemispherical shapes in an entire region of the contact surface 285A. In this case, the plurality of recessed portions 2831 are formed in one step. Thus, in this case, the second recessed portion formation step S13 in the second exemplary embodiment described above is omitted. Further, in the first recessed portion formation step S14, the plurality of recessed portions 2831 that are the plurality of hemispherical shapes are formed in the entire region of the contact surface 285A. However, when the plurality of recessed portions 2831 are formed in one step, the openings M02 are formed in an entire region of the mask M2 illustrated in FIG. 12. Accordingly, strength of the mask M2 deteriorates. As a result, peeling or breakage of the mask M2 may occur.

Thus, the shape of the recessed portion 2841 formed in the second surface 284A of the light-transmitting layer 281A may be different from the shape of the recessed portion 2831 of the first surface 283. Furthermore, after the second surface 284A including the plurality of recessed portions 2841 is formed, the second surface 284A including the plurality of recessed portions 2841 may be formed. Accordingly, deterioration in the strength of the mask M2 is suppressed, and thus, the plurality of recessed portions 2831 having excellent dimensional accuracy can be formed.

With the first lens structure 280A of the second exemplary embodiment described above as well, a global step can be mitigated, similar to the first lens structure 280 of the first exemplary embodiment. Note that, each the recessed portion 2841 is straight, but may be curved. Additionally, each the recessed portion 2841 is a groove that extends along a direction other than a direction along the Y-axis. For example, each the recessed portion 2841 is a groove that extends along the X-axis. Additionally, the plurality of recessed portions 2841 need not be arranged at equal intervals. For example, an interval may widen as a distance to an outside of the light-transmitting layer 281A decreases.

1C. Modified Examples

Each of the exemplary embodiments exemplified above can be variously modified. Specific modification aspects applied to each of the exemplary embodiments described above are exemplified below. Two or more modes freely selected from exemplifications below can be appropriately used in combination as long as mutual contradiction does not arise.

Figure 19:
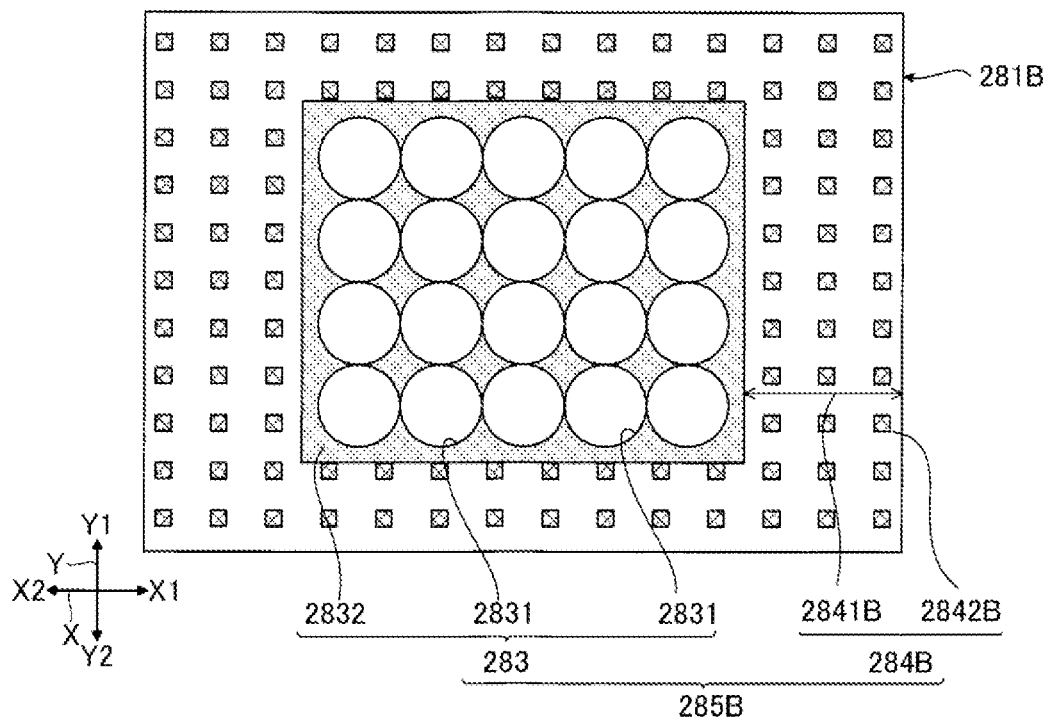
FIG. 19 is a plan view of a light-transmitting layer of a modified example.
Figure 20:
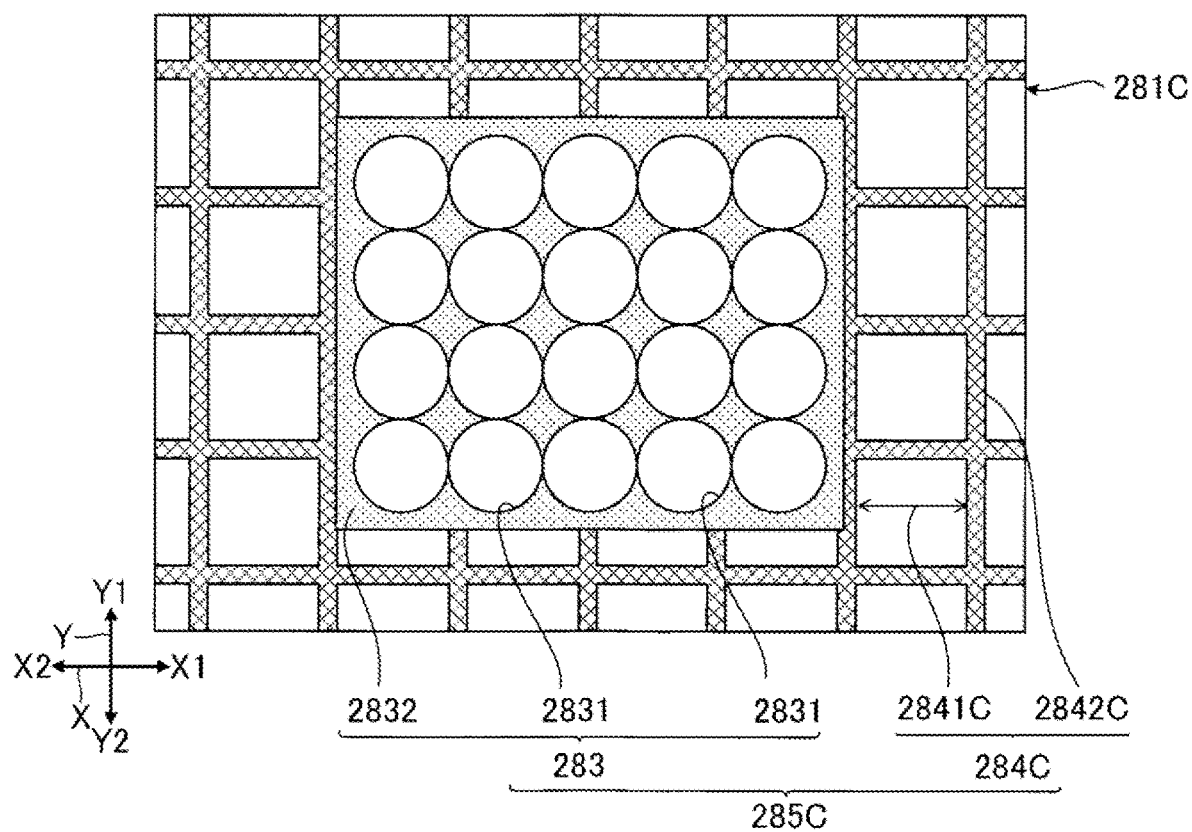
FIG. 20 is a plan view of a light-transmitting layer of a modified example.

In the second exemplary embodiment described above, each the recessed portion 2841 of the second surface 284A is the groove extending along the Y-axis, but the configuration of each the recessed portion 2841 is not limited thereto. For example, examples respectively illustrated in FIG. 19 and FIG. 20 are exemplified. FIG. 19 is plan view of a light-transmitting layer 281B in a modified example. A second surface 284B of the light-transmitting layer 281B illustrated in FIG. 19 has a recessed portion 2841B that forms a lattice shape in plan view. From another perspective, portions of the second surface 284B obtained by excluding the recessed portion 2841B constitute a plurality of convex portions 2842B. The plurality of convex portions 2842B are disposed in a matrix, but may be scattered irregularly. Additionally, a density of the plurality of recessed portions 2831 disposed in the first surface 283 and a density of the recessed portions 2841B disposed in the second surface 284B may be equal. From another perspective, a density of the portion 2832 disposed in the first surface 283 excluding the plurality of recessed portions 2831, and density of the plurality of convex portions 2842B disposed in the second surface 284B may be equal. This allows a global step to be particularly effectively mitigated.

FIG. 20 is plan view of a light-transmitting layer 281C in a modified example. A second surface 284C of the light-transmitting layer 281C illustrated in FIG. 20 has a plurality of recessed portions 2841C each forming a rectangular shape in plan view. The plurality of recessed portions 2841C are disposed in a matrix. From another perspective, a portion of the second surface 284C obtained by excluding the recessed portions 2841C constitutes a convex portion 2842C in a lattice. Further, a density of the plurality of recessed portions 2831 disposed in the first surface 283 and a density of the plurality of recessed portions 2841C disposed in the second surface 284C may be equal. From another perspective, a density of the portion 2832 disposed in the first surface 283 excluding the plurality of recessed portions 2831, and a density of the convex portion 2842C disposed in the second surface 284C may be equal. This allows a global step to be particularly effectively mitigated.

1D. Application Examples

The element substrate 200 illustrated in each of the above exemplary embodiments may be applied to various configurations of the electro-optical device 100. Each of FIG. 21 and FIG. 22 illustrates an exemplary embodiment of an application example of the element substrate 200 illustrated in each the exemplary embodiment.

Figure 21:
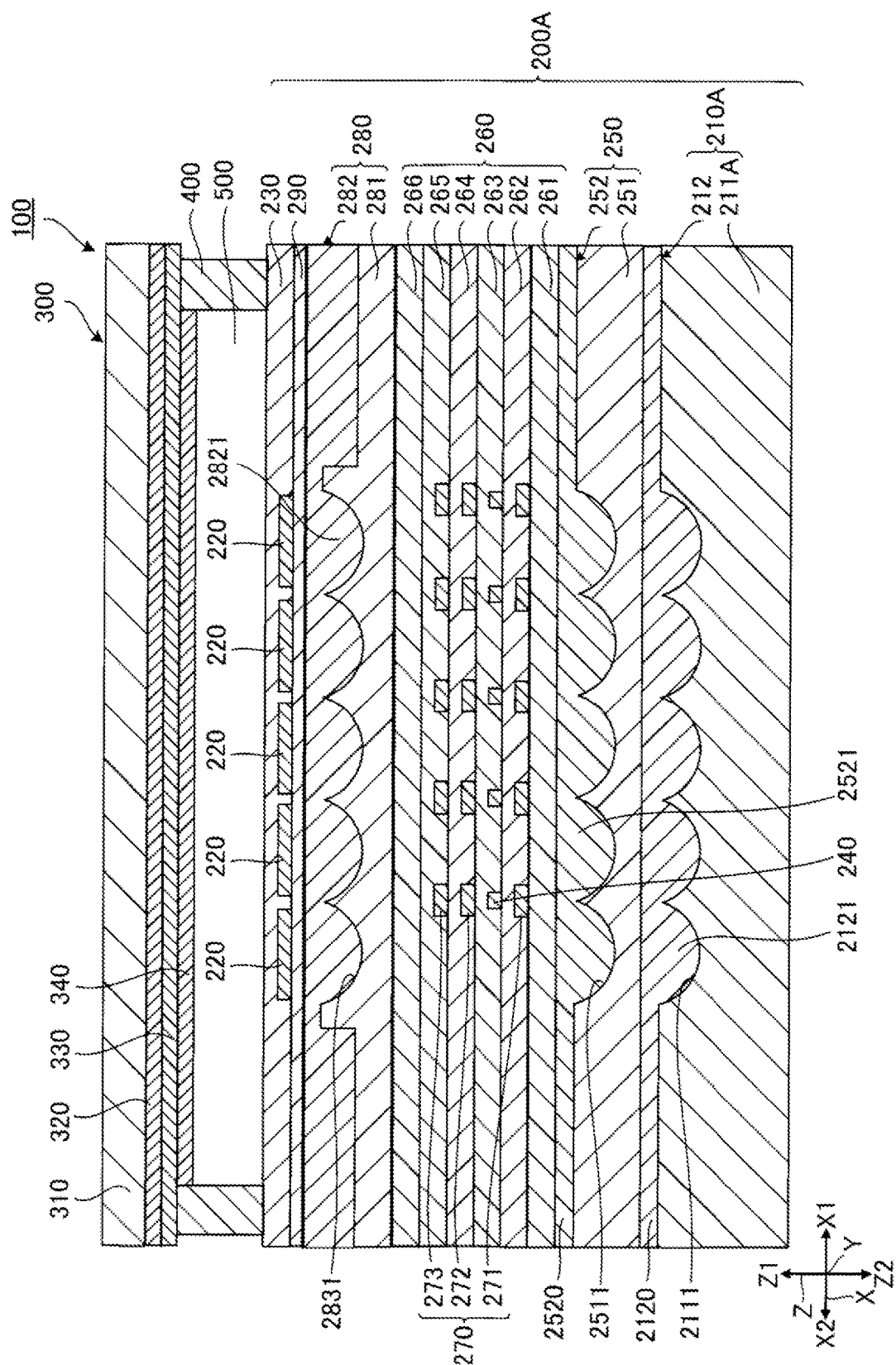
FIG. 21 is a cross-sectional view of an electro-optical device according to a first application example.
Figure 22:
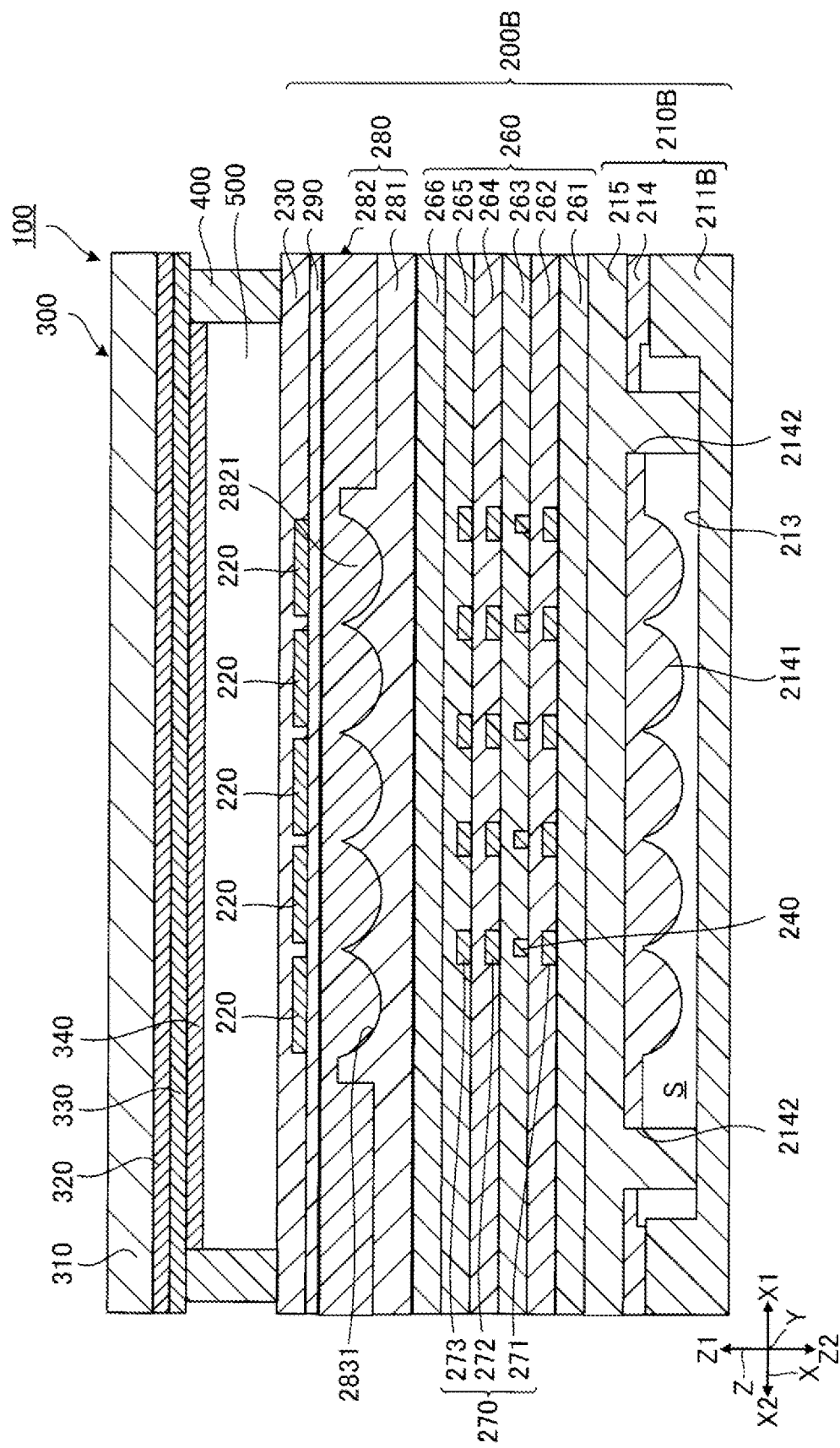
FIG. 22 is a cross-sectional view of an electro-optical device according to a second application example.

FIG. 21 is a cross-sectional view of the electro-optical device 100 according to a first application example taken at a position corresponding to the line B-B in FIG. 1. Note that, the same configurations as the configurations in the electro-optical device 100 illustrated in each the exemplary embodiment described above are denoted by the same reference signs, and detailed description of the same configurations will be omitted.

As illustrated in FIG. 21, an element substrate 200A according to the present application example includes a first base body 210A that constitutes a second lens structure, and a third lens structure 250, in lower layers than the plurality of transistors 240. In this way, by disposing the lens structures in an upper layer and the lower layers than the plurality of transistors 240, light utilization efficiency can be further increased, thus, a further brighter electro-optical device 100 can be realized.

In the element substrate 200A, the first base body 210A, the third lens structure 250, the laminate 260, the first lens structure 280, the protective film 290, the plurality of pixel electrodes 220, and the first alignment film 230 are stacked in this order. Thus, each of the plurality of transistors 240 and the light-shielding bodies 270 is disposed between the third lens structure 250 and the first lens structure 280. Hereinafter, the first base body 210A and the third lens structure 250 will be described sequentially.

The first base body 210A includes a base member 211A and a second lens layer 212, and constitutes a lens array for adjusting a spread angle of light for each the pixel P.

The base member 211A is a plate material being transmissive and having insulating properties. The base member 211A is, for example, formed of glass, quartz, or the like. A surface of the base member 211A that contacts the second lens layer 212 has a plurality of recessed portions 2111. Each the recessed portion 2111 is a curved depression formed in the surface of the base member 211A that contacts the second lens layer 212. Although not illustrated, the plurality of recessed portions 2111 are disposed in a matrix corresponding to a plurality of the pixels P in plan view. The plurality of recessed portions 2111 are disposed corresponding to the plurality of pixel electrodes 220 in a one-to-one manner.

The second lens layer 212 is disposed on the base member 211A so as to fill an inside of the plurality of recessed portions 2111. The second lens layer 212 is a layer formed of a material having a refractive index different from a refractive index of a material of the base member 211A, and is light-transmissive and has insulating properties. The refractive index of the second lens layer 212 may be larger than the refractive index of the base member 211A. Examples of a constituent material for the second lens layer 212 include, for example, inorganic material including silicon such as silicon oxynitride. The second lens layer 212 includes a flat plate shaped flat plate portion 2120 and a plurality of second lenses 2121 each protruding in the Z2 direction from the flat plate portion 2120. The plurality of second lenses 2121 are disposed corresponding to the plurality of recessed portions 2111 in a one-to-one manner. Each the second lens 2121 has a curved surface that functions as a lens surface. The lens surface contacts the recessed portion 2111.

Note that, a protective film formed of, for example, a silicon oxynitride film, a silicon oxide film, or the like may be disposed on a surface of the second lens layer 212 opposite to the base member 211A. Furthermore, the first base body 210A need not be a lens array, and may be merely a flat plate being transmissive and having insulating properties. Further, the flat plate portion 2120 included in the second lens layer 212 may be omitted.

The third lens structure 250 is a lens array for adjusting a spread angle of light for each the pixel P. The third lens structure 250, in cooperation with the aforementioned first base body 210A, adjusts a spread angle of light incident on the liquid crystal layer 500 to be within a desired range for each the pixel P. The third lens structure 250 includes a light-transmitting layer 251 and a third lens layer 252.

The light-transmitting layer 251 is a layer being transmissive and having insulating properties. The light-transmitting layer 251 is formed of an inorganic material containing silicon such as silicon oxide, for example. A surface of the light-transmitting layer 251 that contacts the third lens layer 252 includes a plurality of recessed portions 2511. Each the recessed portion 2511 is a curved depression formed in a surface of the light-transmitting layer 251 that contacts the third lens layer 252. Although not illustrated, the plurality of recessed portions 2511 are disposed in a matrix corresponding to the plurality of the pixels P in plan view. The plurality of recessed portions 2511 are disposed corresponding to the plurality of pixel electrodes 220 in a one-to-one manner.

The third lens layer 252 is disposed on the light-transmitting layer 251 so as to fill an inside of the plurality of recessed portions 2511. The third lens layer 252 is a layer formed of a material having a refractive index different from a refractive index of a material of the light-transmitting layer 251, and is light-transmissive and has insulating properties. The refractive index of the third lens layer 252 may be larger than the refractive index of the light-transmitting layer 251. Examples of a constituent material for the third lens layer 252 include, for example, inorganic material including silicon such as silicon oxynitride. The third lens layer 252 includes a flat plate shaped flat plate portion 2520, and a plurality of third lenses 2521 each protruding in the Z2 direction from the flat plate portion 2520. The plurality of third lenses 2521 are disposed corresponding to the plurality of recessed portions 2511 in a one-to-one manner. Each the third lens 2521 has a curved surface that functions as a lens surface. The lens surface contacts the recessed portion 2511.

Note that, a protective film formed of, for example, a silicon oxynitride film, a silicon oxide film, or the like may be disposed on a surface of the third lens layer 252 opposite to the light-transmitting layer 251. The flat plate portion 2520 included in the third lens layer 252 may be omitted.

Further, it is sufficient that the third lens structure 250 is provided as necessary, and may be omitted.

Note that, the first base body 210A is formed as follows. First, for example, the base member 211A is formed by forming the plurality of recessed portions 2111 in a quartz substrate by etching using a mask. Examples of the etching include, for example, wet etching using a fluorine-based etchant such as hydrogen fluoride (HF). Next, for example, the second lens layer 212 including silicon oxynitride is formed, so as to fill the plurality of recessed portions 2111 of the base member 211A. Next, a flattening process is performed on a surface of the second lens layer 212. Subsequently, the second lens layer 212 is then annealed. Note that, the third lens structure 250 is manufactured by a similar method to the manufacturing method for manufacturing the first base body 210A described above.

Note that, in the present application example, the first base body 210A that constitutes the second lens structure, and the third lens structure 250 may each have similar structure to that of the first lens structure 280.

FIG. 22 is a cross-sectional view of the electro-optical device 100 according to a second application example taken at a position corresponding to the line B-B in FIG. 1. An element substrate 200B includes a first base body 210B that constitutes a fourth lens structure in a lower layer than a plurality of the transistors 240. In this way, by disposing the lens structures in an upper layer and the lower layers than the plurality of transistors 240, light utilization efficiency can be further increased, thus, a further brighter electro-optical device 100 can be realized. Note that, the same configurations as the configurations in the electro-optical device 100 illustrated in each the exemplary embodiment are denoted by the same reference signs, and detailed description of the same configurations will be omitted.

In the element substrate 200B, the first base body 210B, the laminate 260, the first lens structure 280, the protective film 290, the plurality of pixel electrodes 220, and the first alignment film 230 are stacked in this order. Thus, each of the plurality of transistors 240 and the light-shielding bodies 270 is disposed between the first base body 210B that constitutes the fourth lens structure and the first lens structure 280. Hereinafter, the first base body 210B will be described.

A base member 211B is a plate material being transmissive and having insulating properties. The base member 211B is formed of, for example, glass, quartz, or the like. The base member 211B has a recessed portion 213, and a fourth lens layer 214 is disposed so as to cover the recessed portion 213. The fourth lens layer 214 has a plurality of fourth lenses 2141. Due to the presence of the recessed portion 213, a space S exists between the base member 211B and the fourth lens layer 214. The space S is an air tight space, and an inside of the space S is formed of a gas such as air, or a vacuum. Note that, the space S need not be an air tight space.

The light-transmitting layer 215 is disposed on the fourth lens layer 214, and disposed in two through-holes 2142 provided in the fourth lens layer 214. The light-transmitting layer 215 has a portion that penetrates inside the through-hole 2142 and extends toward a bottom surface of the recessed portion 213, and the extended portion contacts the bottom surface of the recessed portion 213. The extended portion of the light-transmitting layer 215 fills an inside of the through-hole 2142 corresponding thereto. Accordingly, the light-transmitting layer 215 blocks the through-hole 2142 corresponding thereto. The base member 211B, the space S, the fourth lens layer 214, and the light-transmitting layer 215 constitute the fourth lens structure.

Note that, in each the application example, the counter substrate 300 does not include a lens structure that converges or diverges light. However, since the element substrate 200 includes the aforementioned plurality of lens structures, even when the counter substrate 300 does not include a lens structure, light utilization efficiency can be sufficiently increased. Accordingly, the electro-optical device 100 being bright can be realized.

Furthermore, the counter substrate 300 does not include a light-shielding film in the display area A10. In other words, the counter substrate 300 does not have a black matrix that is a light-shielding film, at a position corresponding to an interval between the pixel electrode 220 and the pixel electrode 220 of the element substrate 200A in plan view. By adopting the above configuration, light emitted from the counter substrate 300, when passing through the counter substrate 300, does not generate a phase difference due to diffraction by a black matrix, and thus does not cause disturbances in a polarization state. Thus, a reduction in contrast can be suppressed. In addition, when the counter substrate 300 and the element substrate 200A are assembled, so-called assembly displacement does not occur in which respective positions of a black matrix of the counter substrate 300 and the light-shielding body 270 of the element substrate 200A are displaced from each other, and thus, an aperture ratio of the pixel P does not decrease, and brightness does not decrease. Note that, a similar effect is also exhibited for the element substrate 200B.

In this manner, according to each the application example, the electro-optical device 100 that is bright can be realized with high contrast. In particular, when the electro-optical device 100 is disposed such that light is incident from a side of the element substrate 200A, and is exited from a side of the counter substrate 300, a polarization state of light modulated by the liquid crystal layer 500 is not disturbed due to a black matrix, when transmitting through the counter substrate 300, thus contrast performance of the electro-optical device 100 can be further improved. Note that, a similar effect is also exhibited for the element substrate 200B.

Note that, the counter substrate 300 may be configured to include a lens structure that converges or diverges light.

In each of the exemplary embodiments described above, the element substrate 200 has the light-transmitting layer 281 that is the example of the "insulating layer", but the counter substrate 300 may have the "insulating layer". That is, the counter substrate 300 may have the first lens structure 280. Additionally, the "insulating layer" may be disposed in a lower layer than the light-shielding body 270 of the element substrate 200.

In each of the exemplary embodiments described above, the case where the transistor 240 is the TFT has been described as the example, but the transistor 240 is not limited to the TFT, and may be, for example, a metal-oxide-semiconductor field-effect transistor (MOSFET).

In each of the exemplary embodiments described above, the electro-optical device 100 of the active matrix type has been illustrated, but the present disclosure is not limited thereto, and the driving type of the electro-optical device may be a passive matrix type or the like, for example.

2. Electronic Apparatus

The electro-optical device 100 can be used for various electronic apparatuses.

Figure 23:
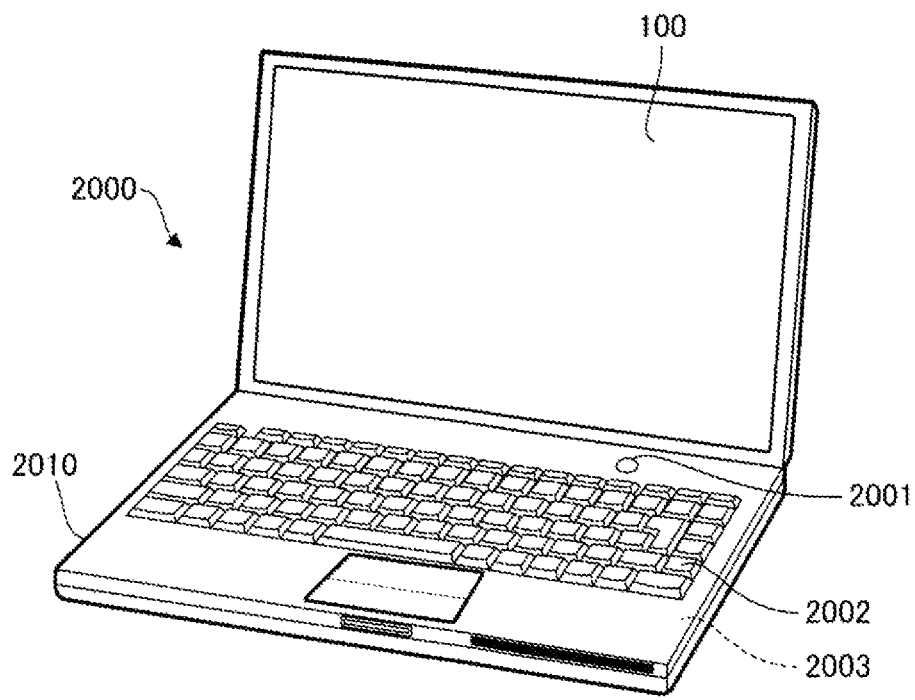
FIG. 23 is a perspective view illustrating a personal computer as an example of an electronic apparatus.

FIG. 23 is a perspective view illustrating a personal computer 2000 as an example of the electronic apparatus. The personal computer 2000 includes the electro-optical device 100 configured to display various images, and a main body portion 2010 in which a power source switch 2001 and a keyboard 2002 are installed, and a control unit 2003. The control unit 2003 includes a processor and a memory, for example, to control operation of the electro-optical device 100.

Figure 24:
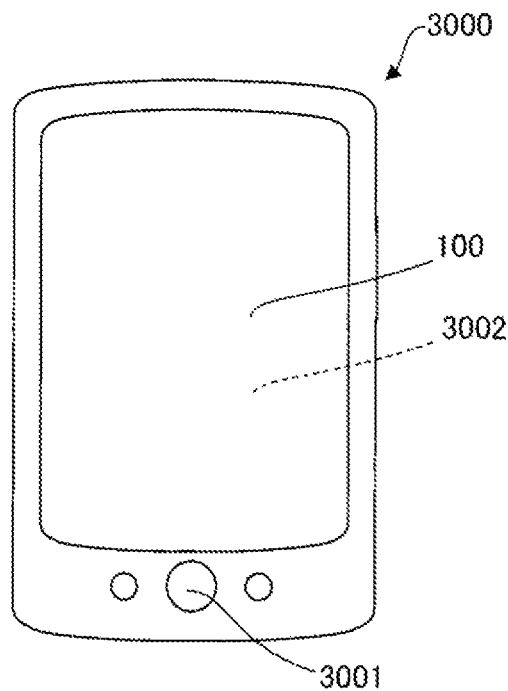
FIG. 24 is a plan view illustrating a smart phone as an example of the electronic apparatus.

FIG. 24 is plan view illustrating a smart phone 3000 as an example of the electronic apparatus. The smart phone 3000 includes an operating button 3001, the electro-optical device 100 that displays various images, and a control unit 3002. Screen contents displayed on the electro-optical device 100 are changed in accordance with operation of the operation button 3001. The control unit 3002 includes a processor and a memory, for example, to control operation of the electro-optical device 100.

Figure 25:
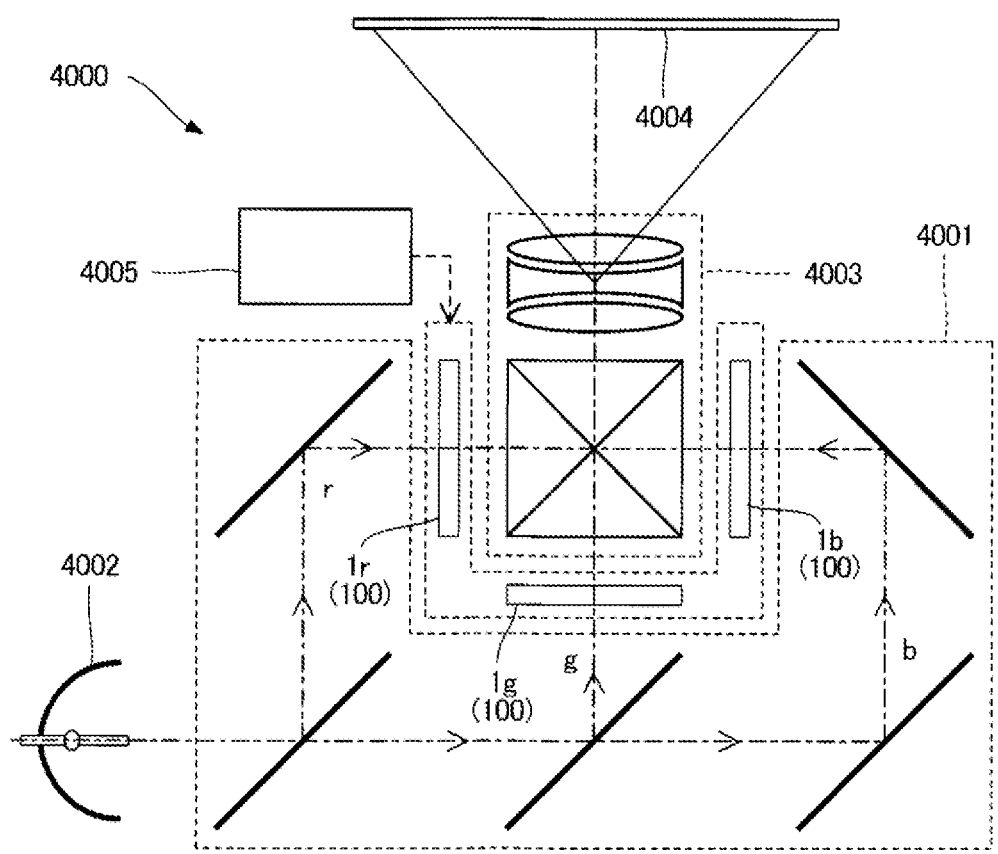
FIG. 25 is a schematic diagram illustrating a projector as an example of the electronic apparatus.

FIG. 25 is a schematic diagram illustrating a projector as an example of the electronic apparatus. A projection-type display device 4000 is a three-plate type projector, for example. An electro-optical device 1r is the electro-optical device 100 corresponding to a red display color, an electro-optical device 1g is the electro-optical device 100 corresponding to a green display color, and an electro-optical device 1b is the electro-optical device 100 corresponding to a blue display color. Specifically, the projection-type display device 4000 includes the three electro-optical devices 1r, 1g, and 1b that respectively correspond to the display colors of red, green, and blue. A control unit 4005 includes a processor and a memory, for example, to control operation of the electro-optical device 100.

An illumination optical system 4001 supplies a red element r of light emitted from an illumination device 4002 as a light source to the electro-optical device 1r, a green element g of the light to the electro-optical device 1g, and a blue element b of the light to the electro-optical device 1b. Each of the electro-optical devices 1r, 1g, and 1b functions as an optical modulator, such as a light bulb, that modulates respective rays of the monochromatic light supplied from the illumination optical system 4001 depending on display images. A projection optical system 4003 combines the rays of the light emitted from each of the electro-optical devices 1r, 1g, and 1b to project the combined light to a projection surface 4004.

The electronic apparatuses described above each include the above-described electro-optical device 100, and the control unit 2003, 3002 or 4005. Since the global step is mitigated as described above in the electro-optical device 100, a distance between the element substrate 200 and the counter substrate 300 can be stabilized. Accordingly, display quality of the personal computer 2000, the smart phone 3000, or the projection-type display apparatus 4000 can be improved.

Note that, the electronic apparatus to which the electro-optical device according to the disclosure is applied are not limited to the exemplified devices, and include a personal digital assistants (PDAs), a digital still camera, a television, a video camera, a car navigation device, a display device for in-vehicle use, an electronic organizer, an electronic paper, an electronic calculator, a word processor, a workstation, a visual telephone, a point of sale (POS) terminal, and the like. Further, electronic apparatuses to which the present disclosure is applied include a device including a printer, a scanner, a copier, a video player, or a touch panel, and the like.

The present disclosure has been described above based on the preferred exemplary embodiments, but the present disclosure is not limited to the exemplary embodiments described above. In addition, the configuration of each component of the present disclosure may be replaced with any configuration that exerts the equivalent functions of the above-described embodiments, and to which any configuration may be added.

In addition, in the above description, the liquid crystal device has been described as the example of the electro-optical device of the present disclosure, but the electro-optical device of the present disclosure is not limited thereto. For example, the electro-optical device of the present disclosure can also be applied to an image sensor or the like. Further, for example, the present disclosure can also be applied to a display panel using light-emitting devices such as organic electro luminescent (EL), inorganic EL, or light-emitting polymers, similarly to the exemplary embodiments described above. Furthermore, the present disclosure can also be applied to an electrophoretic display panel that uses micro capsules each including colored liquid and white particles distributed in the liquid, similarly to the exemplary embodiments described above.

What is claimed is:

1. An electro-optical device including a display area, and a peripheral area located outside the display area in plan view, the electro-optical device, comprising:
   a transmissive base member;
   a plurality of pixel electrodes located in the display area;
   a plurality of transistors disposed corresponding to the plurality of pixel electrodes;
   a transmissive lens layer having a plurality of lenses disposed corresponding to the plurality of pixel electrodes;
   an insulating layer disposed between the transmissive base member and the transmissive lens layer, the insulating layer having a contact surface in contact with the transmissive lens layer, and having a refractive index different from a refractive index of the transmissive lens layer; and
   a light-shielding film disposed between the transmissive base member and the insulating layer, and having a light-shielding property, wherein
   the insulating layer and the transmissive lens layer are disposed between the plurality of transistors and the plurality of pixel electrodes,
   the contact surface has
   a first surface located in the display area, and
   a second surface located in the peripheral area,
   the first surface has a plurality of first recessed portions disposed corresponding to the plurality of lenses, and
   the second surface has one or more second recessed portions.

2. The electro-optical device according to claim 1, wherein
   a refractive index of the transmissive lens layer is larger than a refractive index of the insulating layer.

3. The electro-optical device according to claim 1, wherein
   a density of the plurality of first recessed portions disposed in the first surface is equal to a density of the one or more second recessed portions disposed in the second surface.

4. An electronic apparatus, comprising:
   the electro-optical device according to claim 1; and
   a control unit configured to control operation of the electro-optical device.

5. A manufacturing method of an electro-optical device having a display area in which a plurality of pixel electrodes are disposed, and a peripheral area located outside the display area, the manufacturing method comprising:
   forming a light-shielding film having a light-shielding property at a transmissive base member;
   forming, on the transmissive base member, a plurality of transistors corresponding to the plurality of pixel electrodes;
   forming, at the light-shielding film, a transmissive insulating layer having one or more second recessed portions located in the peripheral area;
   forming a plurality of first recessed portions in the display area of the transmissive insulating layer; and
   forming a lens layer that fills the one or more second recessed portions and the plurality of first recessed portions of the transmissive insulating layer, and has a refractive index different from a refractive index of the transmissive insulating layer,
   wherein the transmissive insulating layer and the lens layer are disposed between the plurality of transistors and the plurality of pixel electrodes.

* * * * *